United States Patent
Yu

(10) Patent No.: US 9,183,927 B2
(45) Date of Patent: Nov. 10, 2015

(54) MEMORY DEVICES, METHODS OF STORING AND READING DATA, SMM JUNCTIONS, AND METHODS OF PREPARING ALUMINA SUBSTRATES

(75) Inventor: Lam H. Yu, Houston, TX (US)

(73) Assignee: The University of Memphis Research Foundation, Memphis, TN (US)

( * ) Notice: Subject to any disclaimer, the term of this patent is extended or adjusted under 35 U.S.C. 154(b) by 506 days.

(21) Appl. No.: 13/499,755

(22) PCT Filed: Oct. 4, 2010

(86) PCT No.: PCT/US2010/051297
§ 371 (c)(1),
(2), (4) Date: Nov. 21, 2012

(87) PCT Pub. No.: WO2011/041772
PCT Pub. Date: Apr. 7, 2011

(65) Prior Publication Data
US 2013/0058149 A1    Mar. 7, 2013

Related U.S. Application Data

(60) Provisional application No. 61/248,153, filed on Oct. 2, 2009.

(51) Int. Cl.
*H01L 29/18* (2006.01)
*G11C 13/00* (2006.01)

(52) U.S. Cl.
CPC ........ *G11C 13/0014* (2013.01); *G11C 13/0016* (2013.01); *Y10T 428/31678* (2015.04)

(58) Field of Classification Search
USPC .......................................... 257/2–5; 365/148
See application file for complete search history.

(56) References Cited

U.S. PATENT DOCUMENTS

| 6,753,247 B1 | 6/2004 | Okoroanyanwu et al. |
| 2004/0159835 A1* | 8/2004 | Krieger et al. .................. 257/40 |
| 2007/0194301 A1 | 8/2007 | Sezi et al. |
| 2010/0084741 A1* | 4/2010 | Andres et al. ................. 257/536 |

OTHER PUBLICATIONS

Banerjee, Subarna et al., "The detection of improvised nonmilitary peroxide based explosives using a titania nanotube array sensor," Nanotechnology, vol. 20:075502, 6 pages (2009).

(Continued)

*Primary Examiner* — Cheung Lee
*Assistant Examiner* — Frederick B Hargrove
(74) *Attorney, Agent, or Firm* — Mintz Levin Cohn Ferris Glovsky and Popeo, P.C.; Peter F. Corless; Jonathon P. Western

(57) ABSTRACT

Various aspects of the invention provide memory devices, methods of storing and reading data, and silver/molecular-layer/metal (SMM) junctions. One aspect of the invention provides a memory device including a plurality of SMM junctions and an electrical structure configured to permit application of electricity across one or more of the plurality of SMM junctions. Another aspect of the invention provides a method of storing data on a memory device including a plurality of SMM junctions. The method includes applying electrical energy across a subset of the SMM junctions to switch the junction to a more conductive state. Another aspect of the invention provides an SMM junction including a silver layer, a copper layer, and a molecular layer positioned between the silver layer and the copper layer.

22 Claims, 31 Drawing Sheets

(56) References Cited

OTHER PUBLICATIONS

Beebe, Jeremy M. et al., "Nanoscale switch elements from self-assembled monolayers on silver," Applied Physics Letters, vol. 90:083117-1-083117-3 (2007).

Evans, P. et al., "Growth and properties of gold and nickel nanorods in thin film alumina," Nanotechnology, vol. 17:5746-5753 (2006).

Guha, Santanu et al., "AutoWitness: Locating and Tracking Stolen Property While Tolerating GPS and Radio Outages," SenSys '10 Proceedings of the 8th ACM Conference on Embedded Networked Sensor Systems, pp. 29-42 (2010).

Guo, Xin et al., "Understanding the switching-off mechanism in Ag+ migration based resistively switching model systems," Applied Physics Letters, vol. 91:133513-1-133513-3 (2007).

Harper, Ross J. et al., "Identification of dominant odor chemicals emanating from explosives for use in developing optimal training aid combinations and mimics for canine detection," Talanta, vol. 67:313-327 (2005).

Kohman, G.T. et al., "Silver Migration in Electrical Insulation," The Bell System Technical Journal, vol. 34(6):1115-1147 (1955).

Kushmerick, J.G. et al., "Conductance Scaling of Molecular Wires in Parallel," Nano Letters, vol. 3(7):897-900 (2003).

Long, David P. et al., "Magnetic directed assembly of molecular junctions," Applied Physics Letters, vol. 86:153105-1-153105-3 (2005).

Lu, Wei et al., "Nanoelectronics from the bottom up," Nature Materials, vol. 6:841-850 (2007).

Martin, Charles R., "Nanomaterials: A Membrane-Based Synthetic Approach," Science, vol. 266:1961-1966 (1994).

Mbindyo, Jeremiah K.N. et al., "Template Synthesis of Metal Nanowires Containing Monolayer Molecular Junctions," J. Am. Chem. Soc., vol. 124:4020-4026 (2002).

Negishi, R. et al., "Fabrication of nanoscale gaps using a combination of self-assembled molecular and electron beam lithographic techniques," Applied Physics Letters, vol. 88:223111-1-223111-3 (2006).

Routkevitch, Dmitri et al., "Electrochemical Fabrication of CdS Nanowire Arrays in Porous Anodic Aluminum Oxide Templates," J. Phys. Chem., vol. 100:14037-14047 (1996).

Rudra, Balu et al., "Failure-Mechanism Models for Conductive-Filament Formation," IEEE Transactions on Reliability, vol. 43(1):354-360 (1994).

Singh, Suman et al., "Sensors—An effective approach for the detection of explosives," Journal of Hazardous Materials, vol. 144:15-28 (2007).

Yu, Lam H. et al., "Origin of Discrepancies in Inelastic Electron Tunneling Spectra of Molecular Junctions," Physical Review Letters, vol. 98:206803-1-206803-4 (2007).

Yu, Lam H. et al., "Structural Contributions to Charge Transport across Ni-Octanedithiol Multilayer Junctions," Nano Letters, vol. 6(11):2515-2519 (2006).

\* cited by examiner

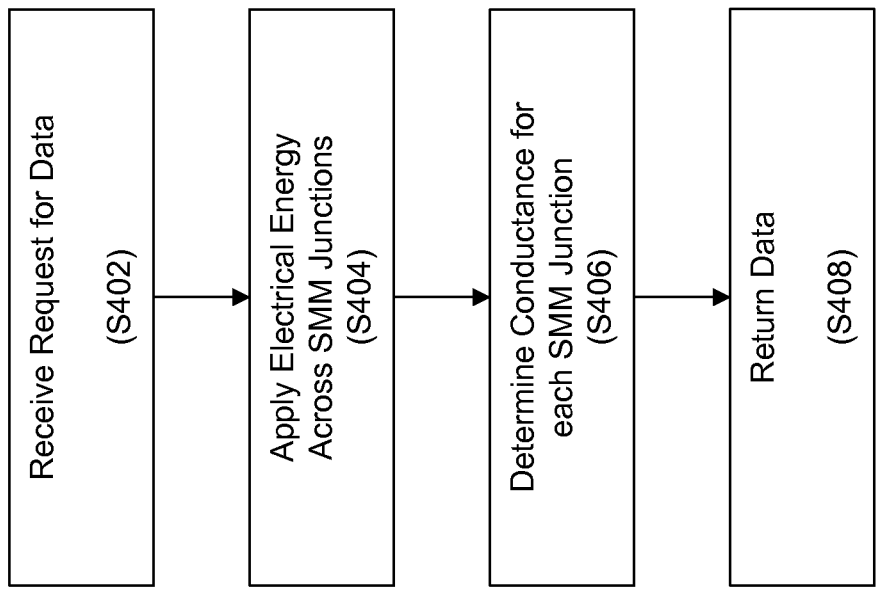
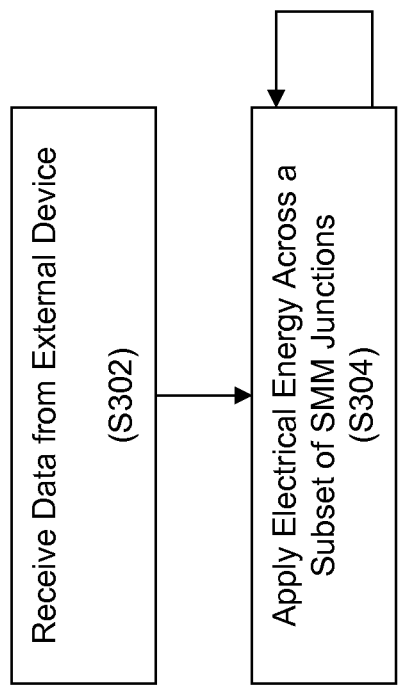

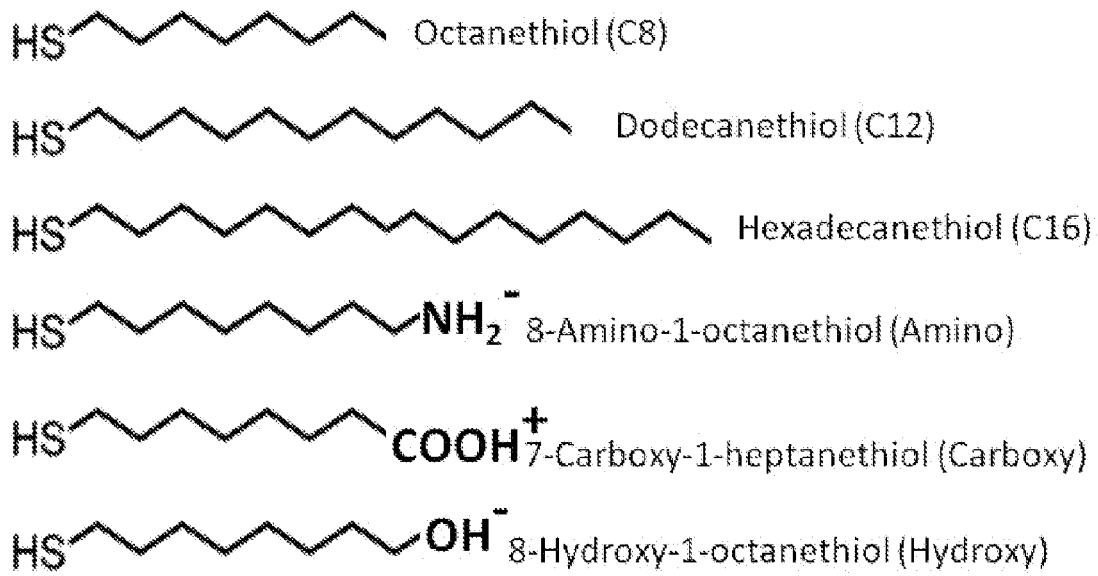
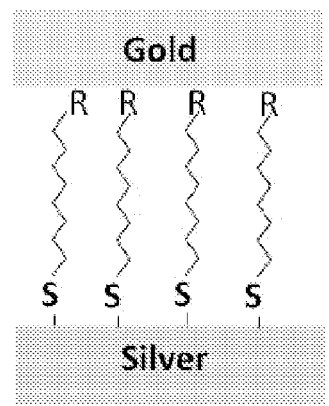
All molecular layer are assembled with the thiol bonded to the silver.
FIG. 5

MEMORY DEVICES, METHODS OF STORING AND READING DATA, SMM JUNCTIONS, AND METHODS OF PREPARING ALUMINA SUBSTRATES

CROSS REFERENCE TO RELATED APPLICATIONS

This application is a 35 U.S.C. §371 U.S. national entry of International Application PCT/US2010/051297 (WO 2011/041772) having an International filing date of Oct. 4, 2010 which claims priority to U.S. Provisional Patent Application Ser. No. 61/248,153, filed Oct. 2, 2009. The entire content of the above-referenced patent applications are hereby incorporated by reference herein.

BACKGROUND

Although the capacity of existing memory devices (e.g., hard disk drives, flash drives, and the like) have rapidly grown, the demands of consumer, commercial, industrial, and government users continues to keep pace and, in some instances, outpace currently technologies. For example, a 30 gigabyte portable media player that provided more than adequate storage five years ago may now be inadequate to store the ever-increasing catalog of full-length motion pictures available for purchase and download.

In many applications, merely increasing storage capacity by adding additional discs or chips is often not acceptable or desirable, particularly in portable devices.

Accordingly, there is a need for improved memory devices that are capable of storing large amounts of data in small footprint.

SUMMARY OF THE INVENTION

Various aspects of the invention provide memory devices, methods of storing and reading data, and silver/molecular-layer/metal (SMM) junctions.

One aspect of the invention provides a memory device including a plurality of SMM junctions and an electrical structure configured to permit application of electricity across one or more of the plurality of SMM junctions.

This aspect of the invention can have a variety of embodiments. In one embodiment, the plurality of SMM junctions are formed within a porous membrane. The porous membrane can be selected from the group consisting of: an alumina-membrane-based filter paper, an etched polycarbonate membrane, and an anodized metallic oxide film. The metallic oxide can be selected from group consisting of: aluminum oxide, titanium oxide, and tantalum oxide. The electrical structure can have a crossbar geometry.

The memory device can include a control device configured to selectively apply electricity across one or more of the SMM junctions via the electrical structure. The control device can be further configured to calculate the conductance of one or more of the SMM junctions.

The memory device can include an interface configured for communicative coupling with an external device. The interface can be a wired interface. The wired interface can be selected from the group consisting of: USB, USB 2.0, IEEE 1394, PCI, Ethernet, and Gigabit Ethernet. The interface can be a wireless interface. The wireless interface can be selected from the group consisting of: Bluetooth, IEEE 802.11, and IEEE 802.15.4. The control device can be further configured to communicate with the external device via the interface.

In some embodiments, the SMM junctions include a metal-perchlorate salt. In other embodiments, the SMM junctions include one selected from the group consisting of: copper, gold, or nickel.

The molecular layer can include a thiol. The thiol can be selected from the group consisting of: monothiolated oligo(phenylene-ethynylene), octanethiol ($C_8SH$), decanethiol ($C_{10}SH$), dodecanethiol ($C_{12}SH$), hexadecanethiol ($C_{16}SH$), and octadecanethiol ($C_{18}SH$). The thiol can include an amino functional group. The thiol can be 8-amino-1-octanethiol. The thiol can include a carboxyl functional group. The thiol can be 7-carboxy-1-heptanethiol. The thiol can include a hydroxyl functional group. The thiol can be 8-hydroxy-1-octanethiol.

Another aspect of the invention provides a method of storing data on a memory device including a plurality of SMM junctions. The method includes applying electrical energy across a subset of the SMM junctions to switch the junction to a more conductive state.

This aspect can have a variety of embodiments. In one embodiment, the electrical energy has an oscillating voltage. The electrical energy can be applied a plurality of times across the subset of the SMM junctions.

Another aspect of the invention provides a method of reading data on a memory device including a plurality of SMM junctions. The method includes applying electrical energy across the SMM junctions, determining the conductance of each of the SMM junctions, and returning a data string including a "1" for each of the SMM junctions that exhibits a high conductance and a "0" for each of the SMM junctions that exhibits a low conductance.

This aspect can have a variety of embodiments. In one embodiment, the electrical energy has a lower voltage than an encoding electrical energy.

Another aspect of the invention provides an SMM junction including a silver layer, a copper layer, and a molecular layer positioned between the silver layer and the copper layer.

This aspect can have a variety of embodiments. The molecular layer can include a thiol. The thiol can be selected from the group consisting of: monothiolated oligo(phenylene-ethynylene), octanethiol ($C_8SH$), decanethiol ($C_{10}SH$), dodecanethiol ($C_{12}SH$), hexadecanethiol ($C_{16}SH$), and octadecanethiol ($C_{18}SH$). The thiol can include an amino functional group. The thiol can be 8-amino-1-octanethiol. The thiol can include a carboxyl functional group. The thiol can be 7-carboxy-1-heptanethiol. The thiol can include a hydroxyl functional group. The thiol can be 8-hydroxy-1-octanethiol.

Another aspect of the invention provides a method of preparing an alumina substrate. The method includes: (a) providing a piece of aluminum, (b) electropolishing the piece of aluminum, (c) anodizing the piece of aluminum, (d) removing the anodization, and (e) anodizing the piece of aluminum.

This aspect can have a variety of embodiments. Steps (c) and (d) can be performed a plurality of times before performing step (e).

FIGURES

For a fuller understanding of the nature and desired objects of the present invention, reference is made to the following detailed description taken in conjunction with the figure wherein:

FIG. 3 depicts a method of storing data according to one embodiment of the invention;

FIG. 4 depicts a method of reading data from a memory device including a plurality of SMM junctions according to one embodiment of the invention;

FIG. 5 depicts a plurality of exemplary materials for use as molecular layers and the arrangement of said materials with a thiol bonded to a silver layer according to embodiments of the invention;

Figure 7A:
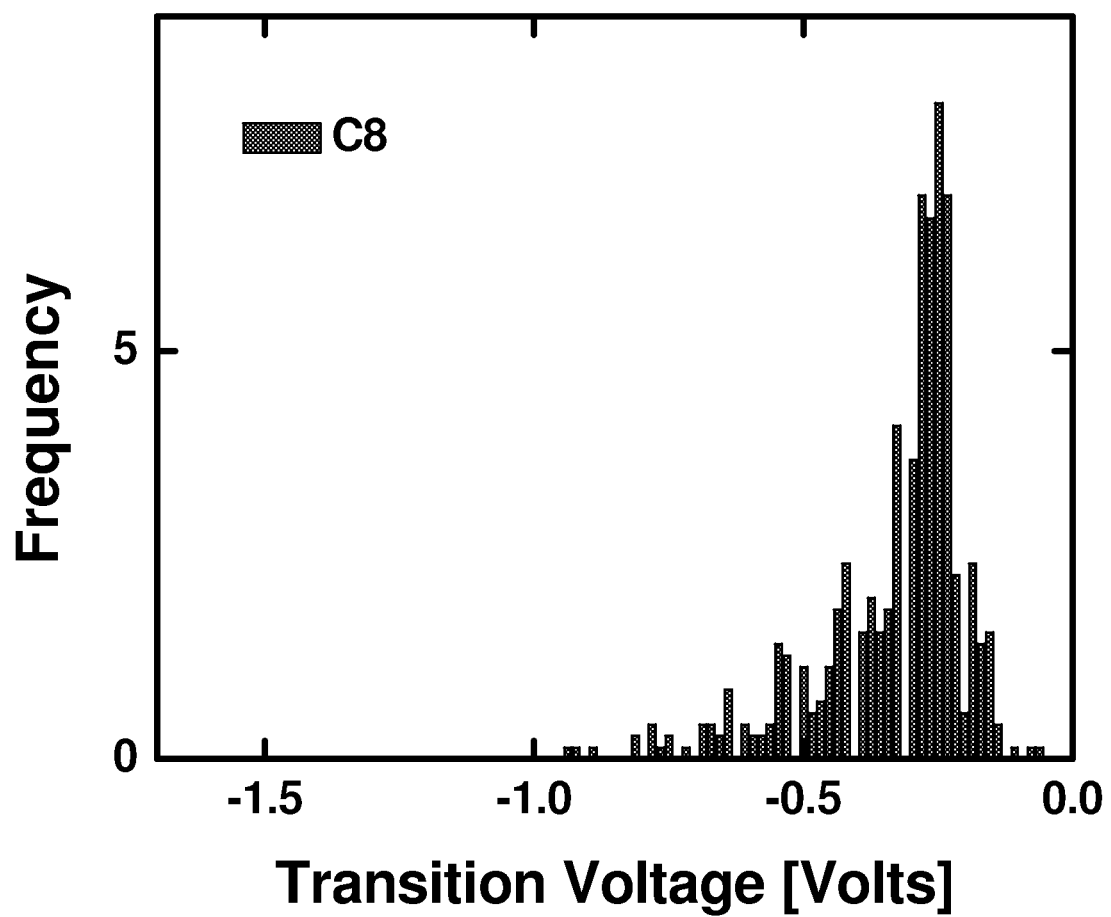
Figure 7B:
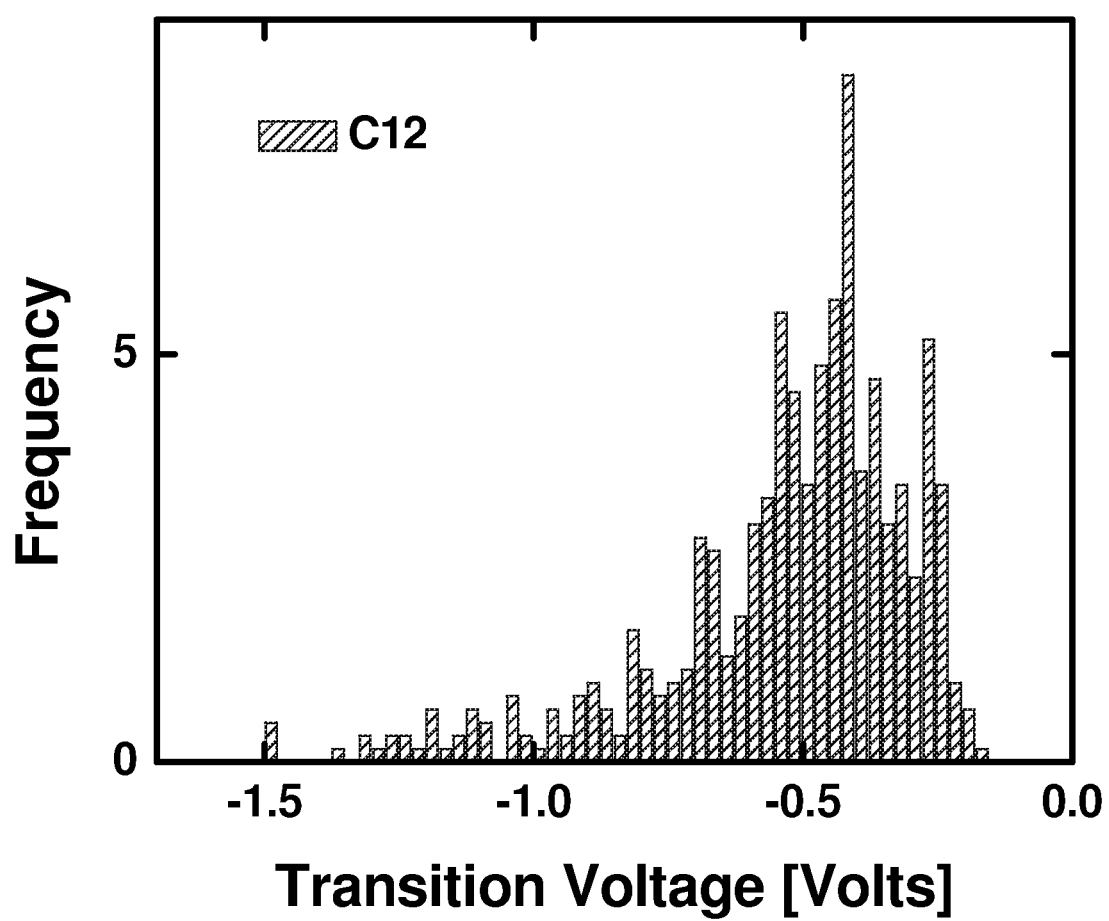
Figure 7C:
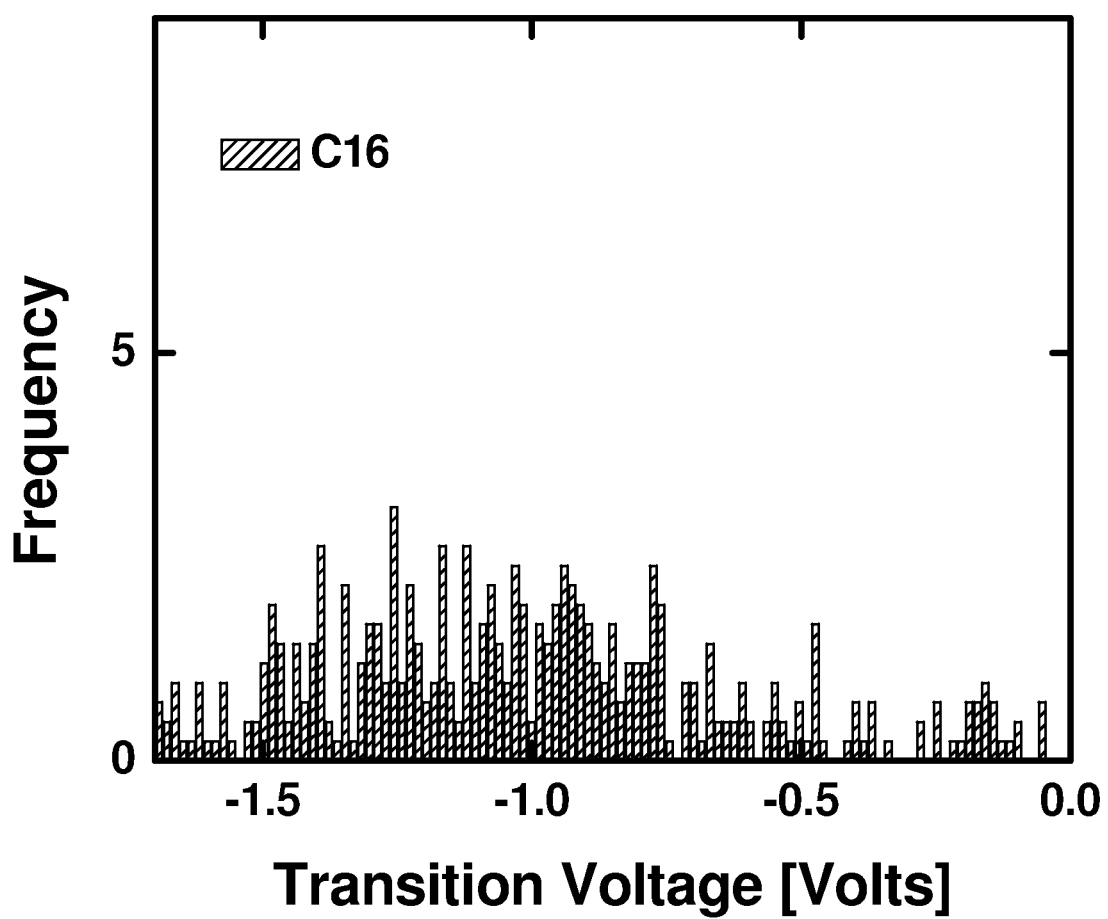
Figure 8A:
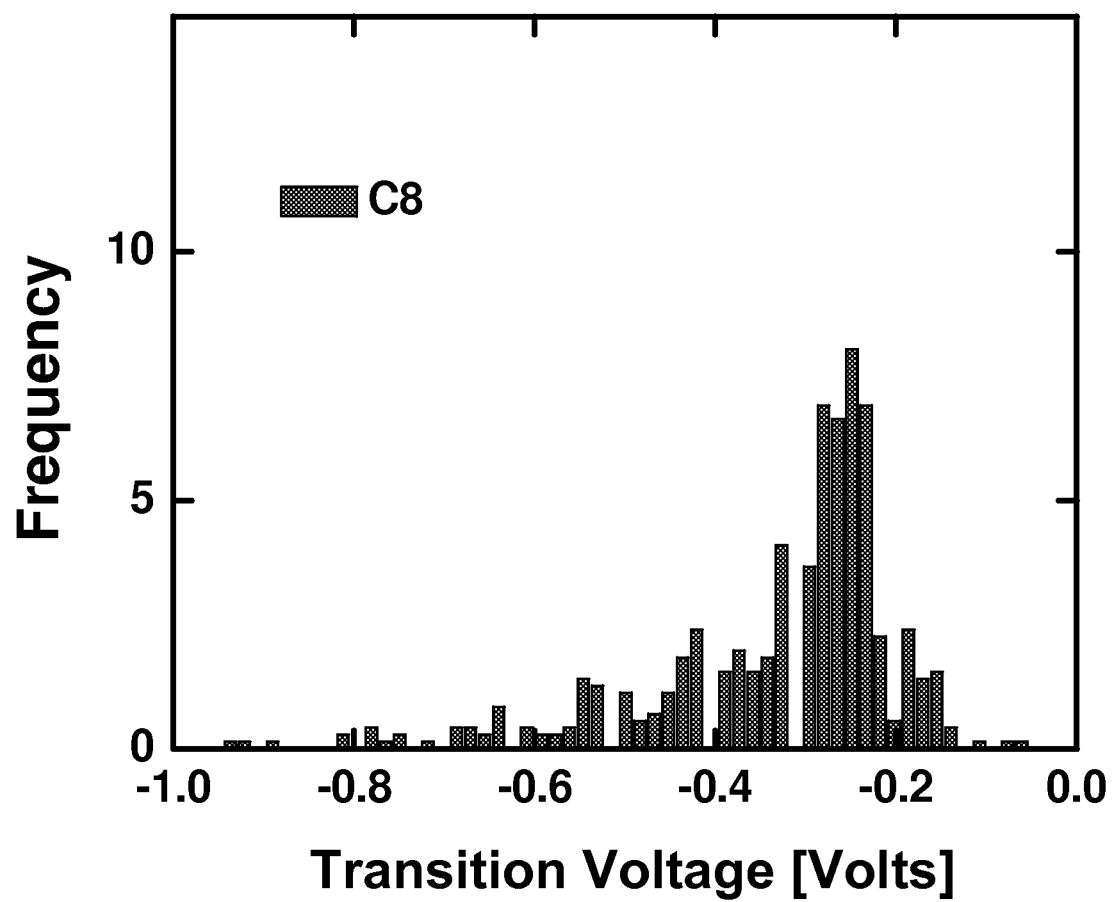
Figure 8B:
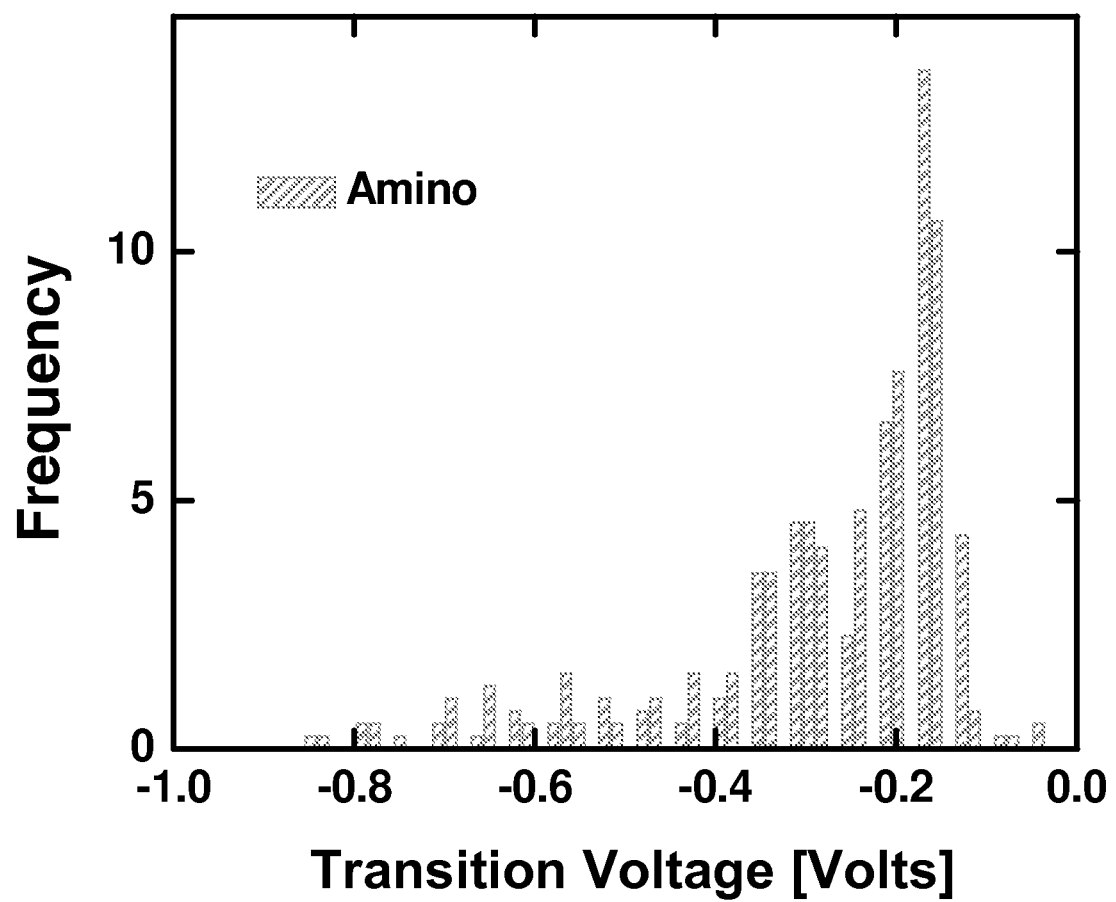
Figure 8C:
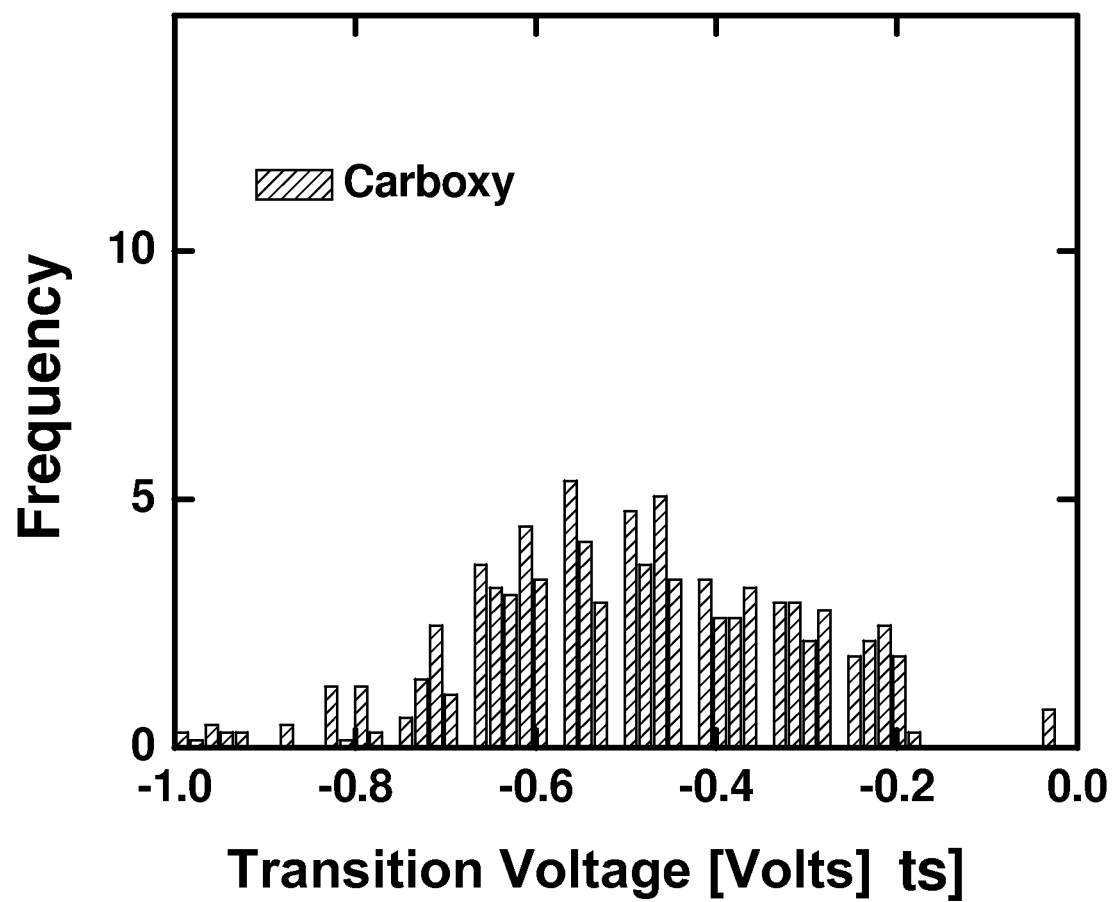
Figure 9A:
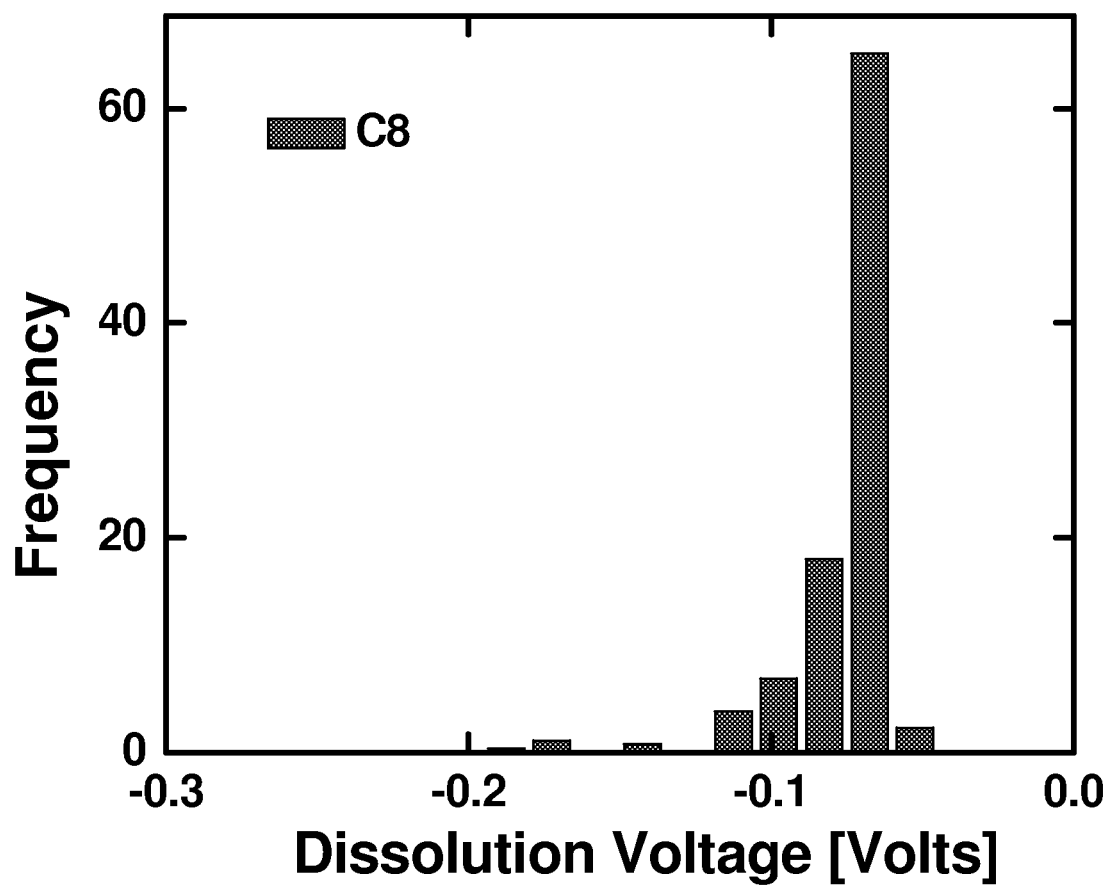
Figure 9B:
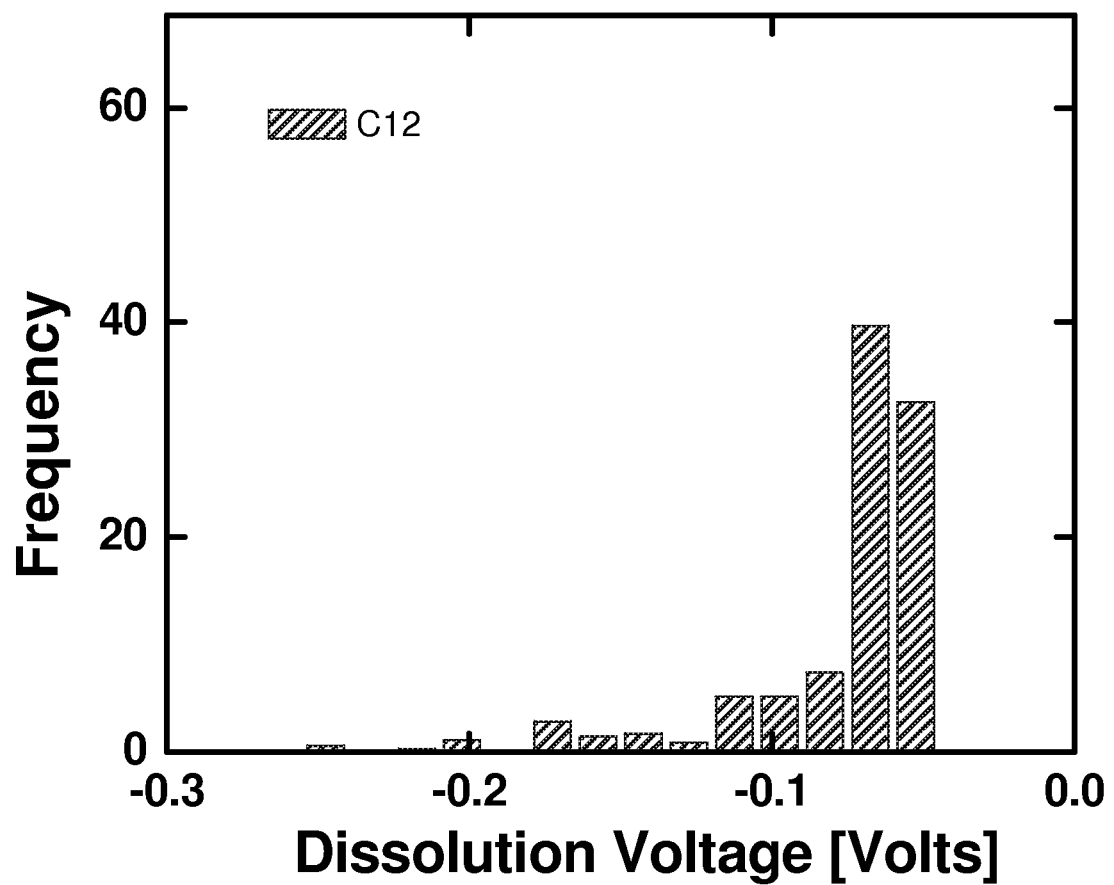
Figure 9C:
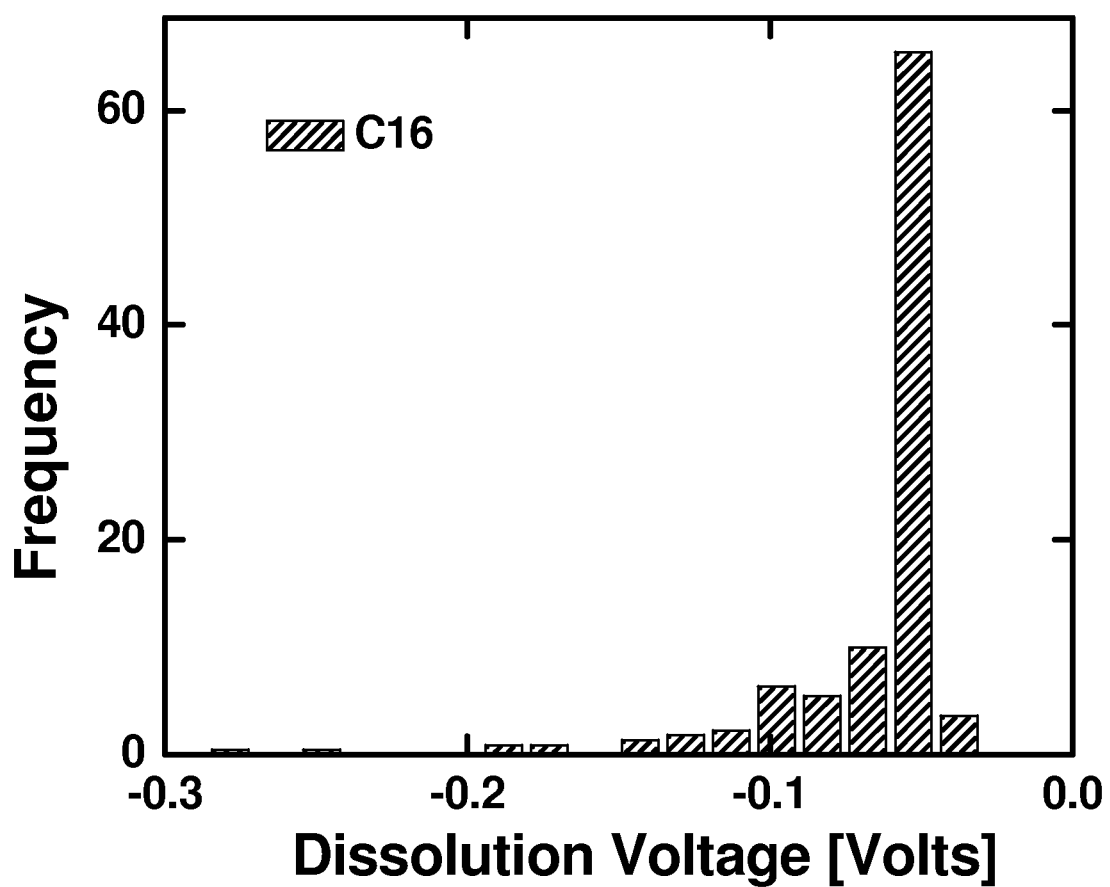
Figure 10:
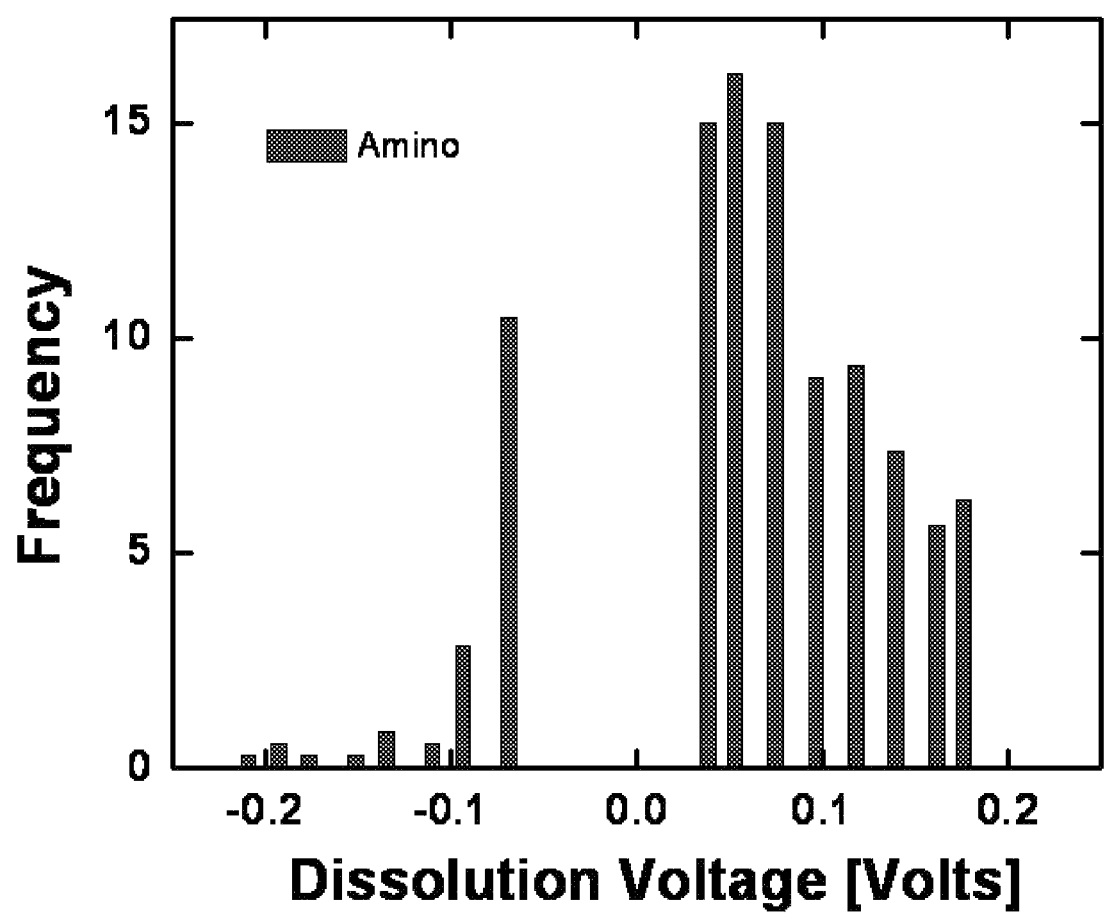
Figure 11:
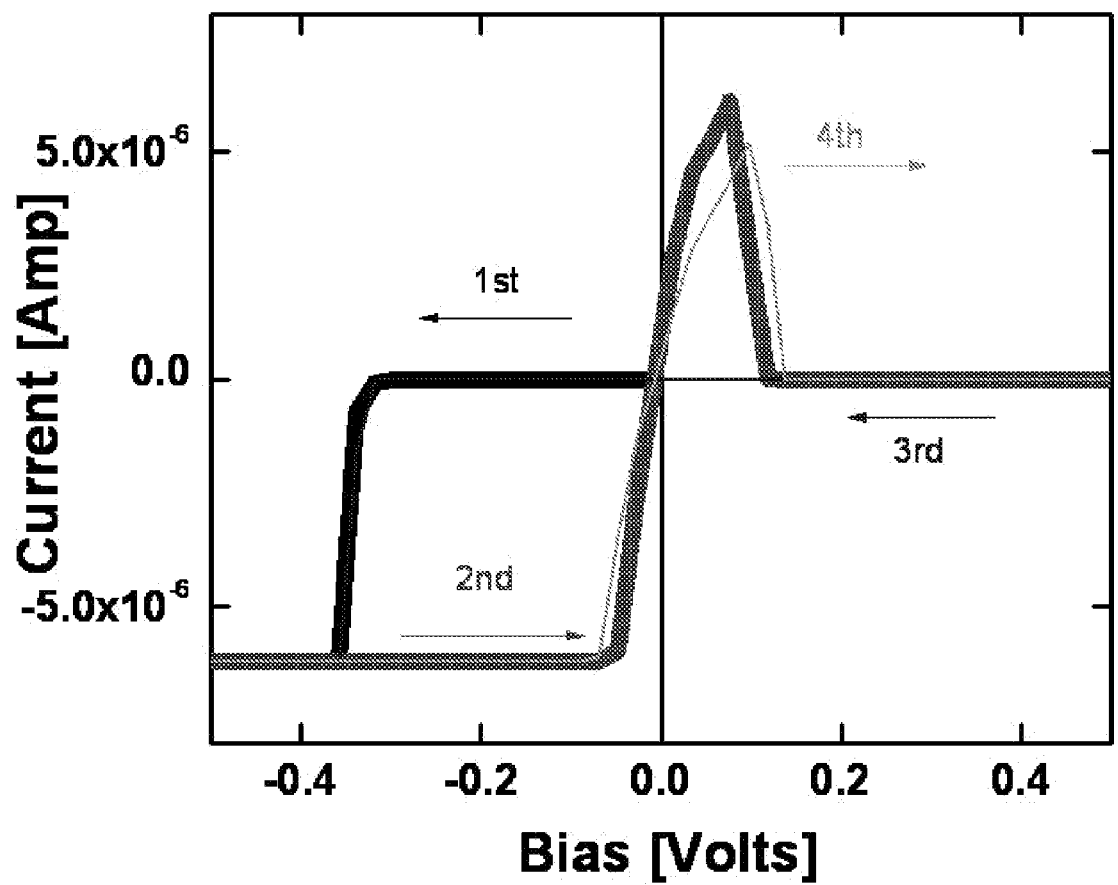
Figure 12A:
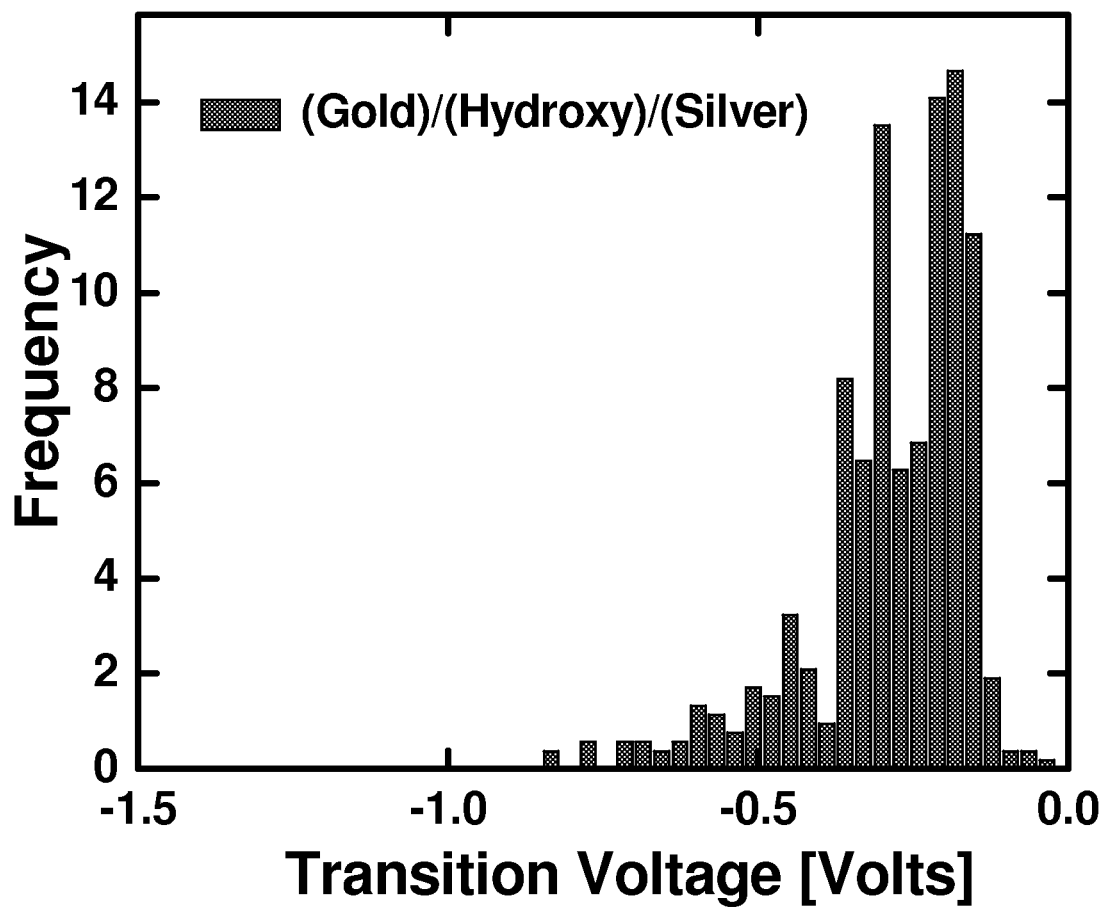
Figure 12B:
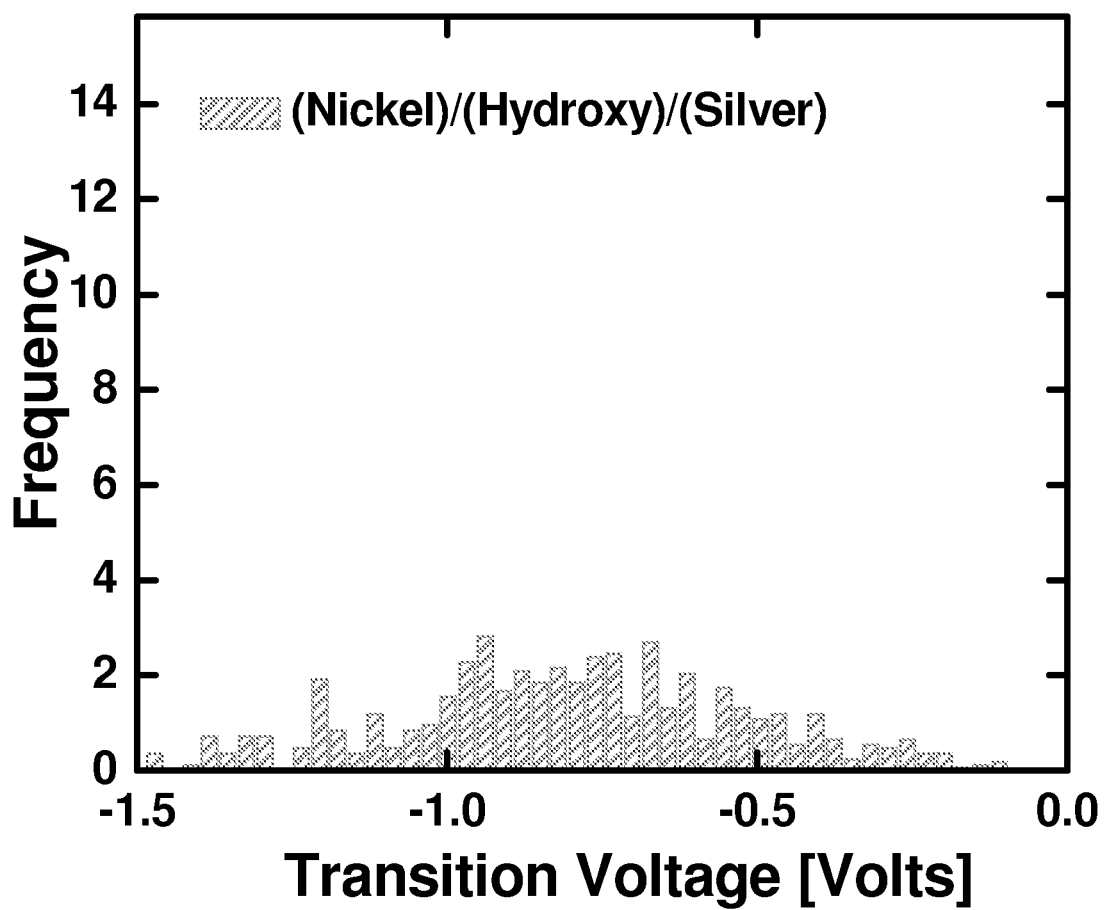
Figure 13A:
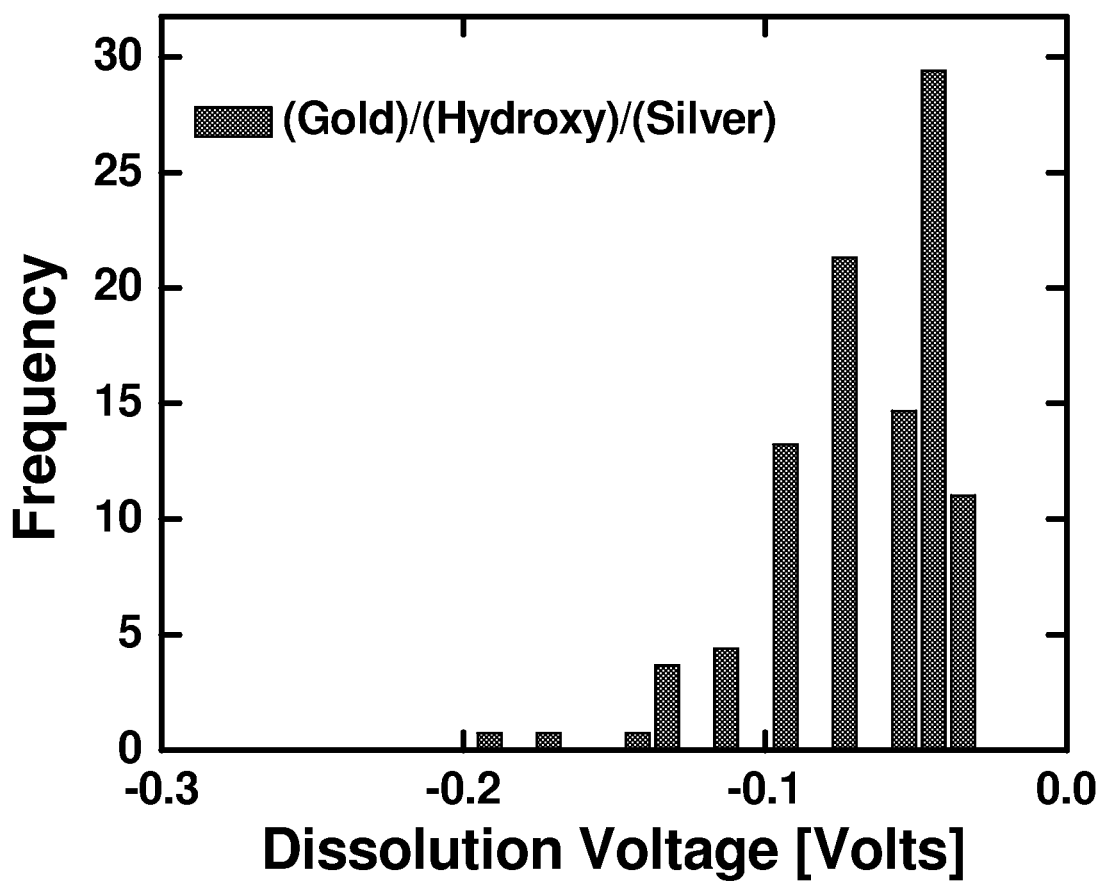
Figure 13B:
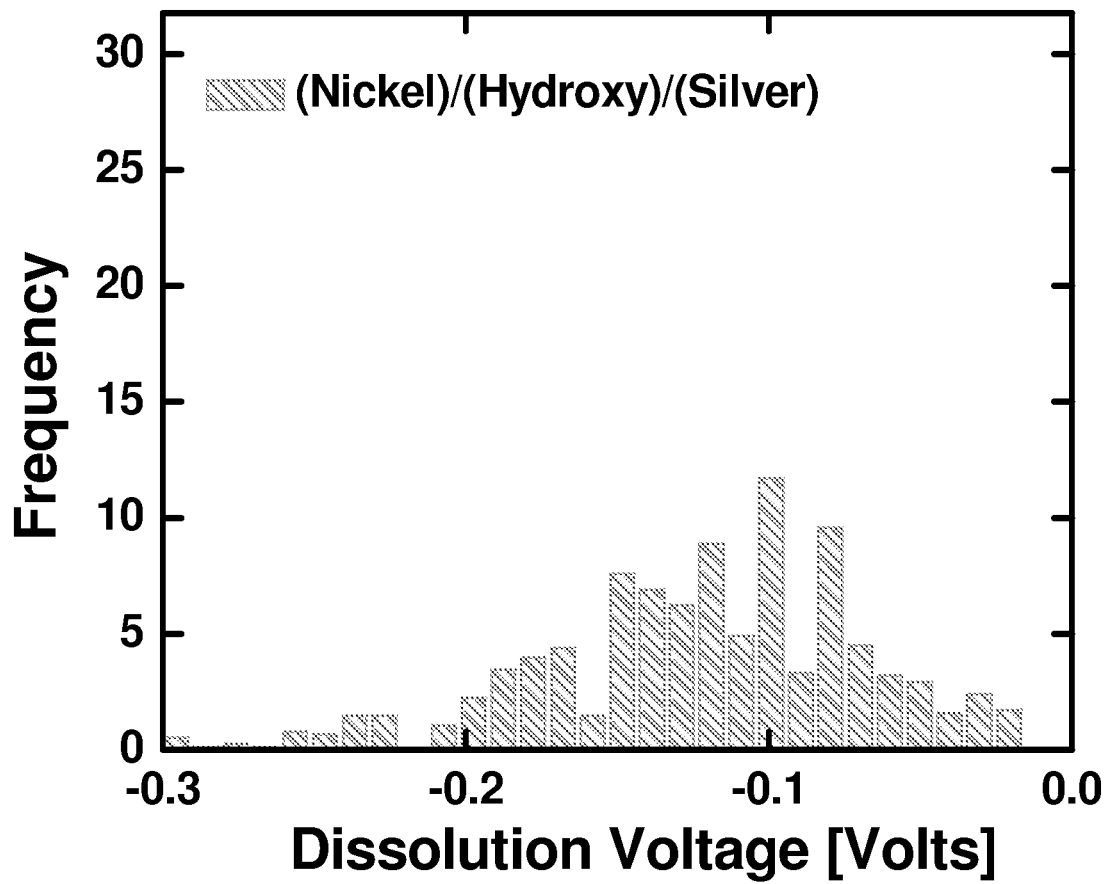
Figure 14:
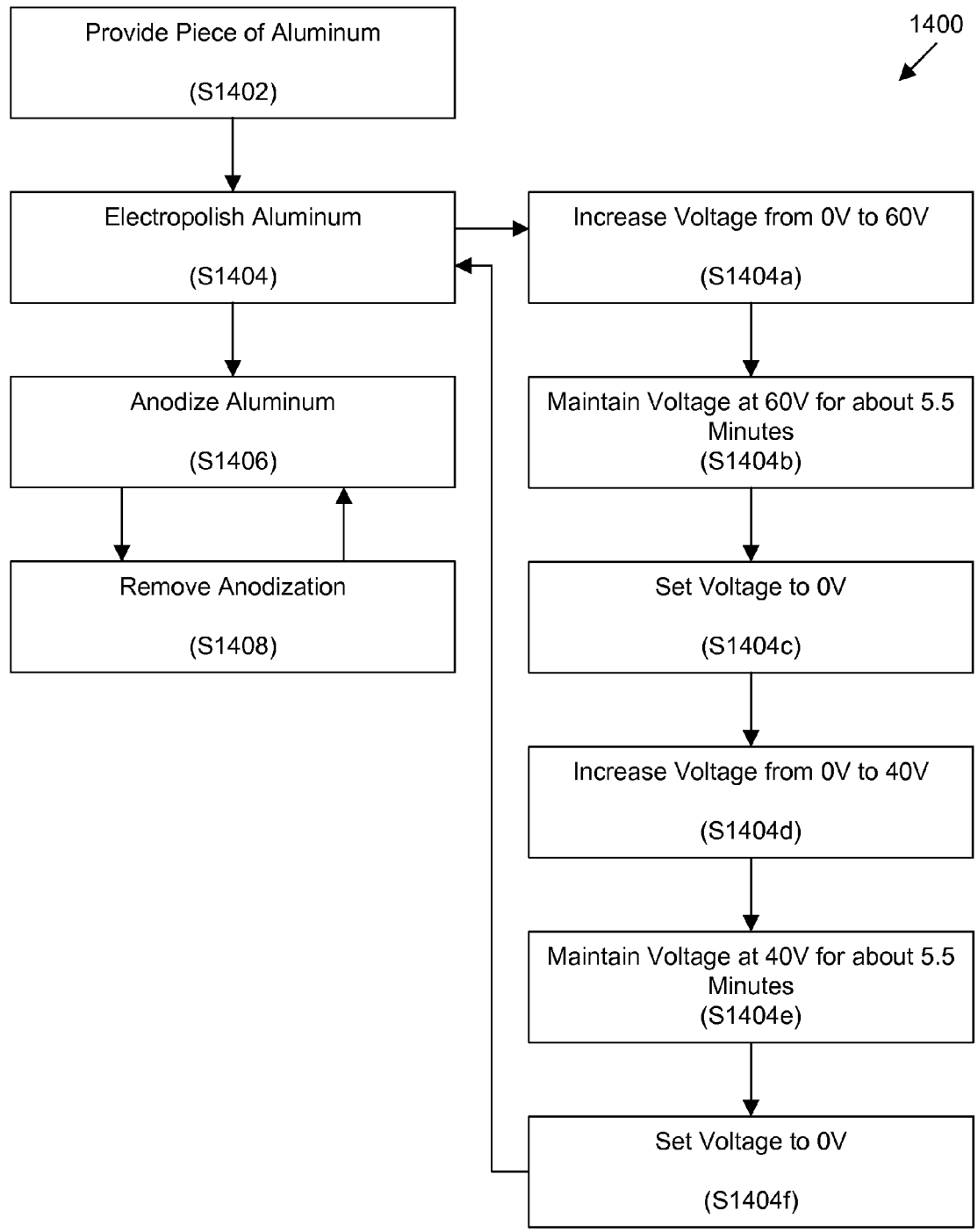
Figure 15:
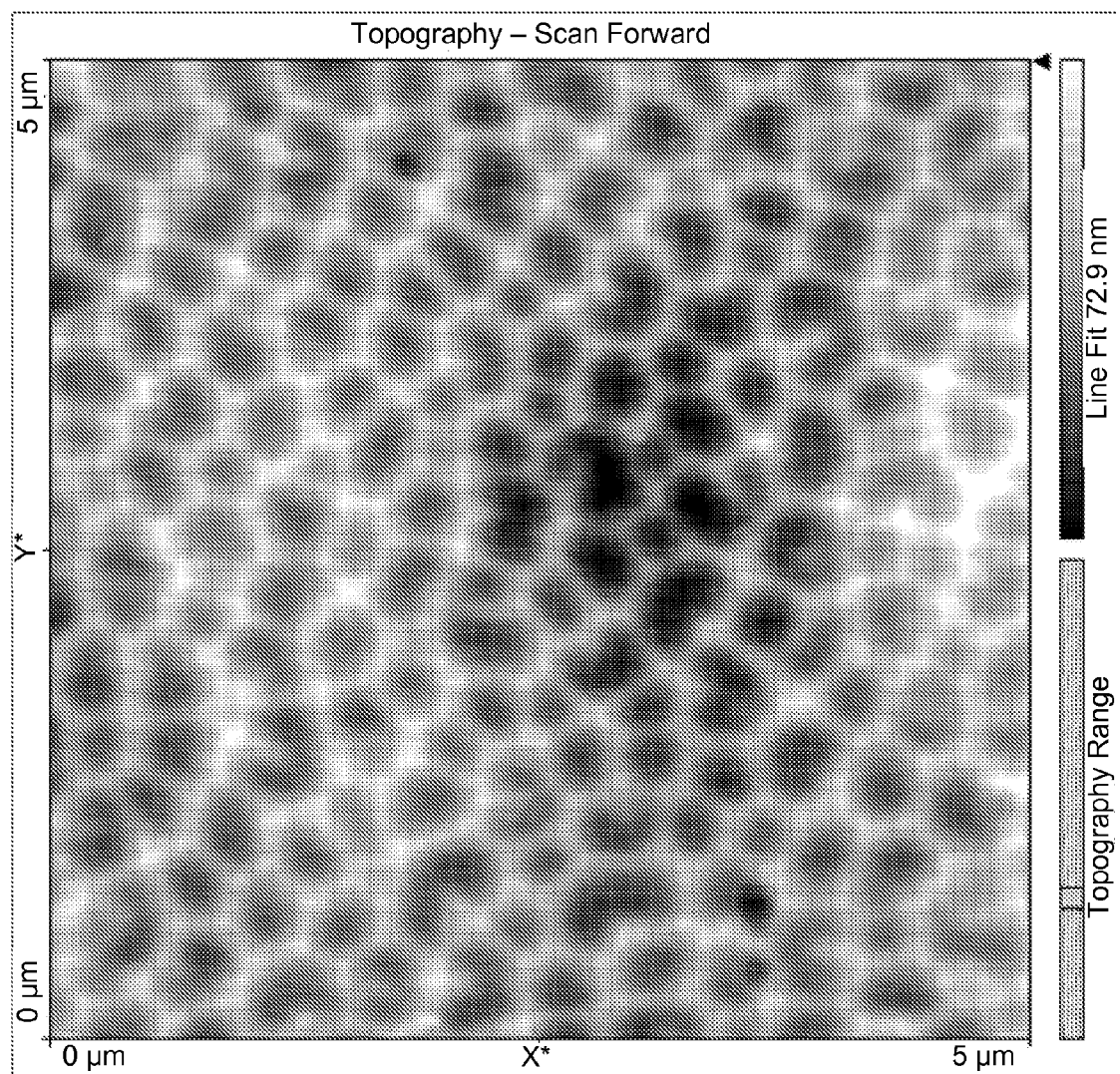

FIGS. 7A, 7B, and 7C depict the distribution of transition voltages of junctions having a molecular layer consisting of C8, C12, and C16, respectively, according to embodiments of the invention;

FIGS. 8A, 8B, and 8C depict the transition voltage distribution of junctions having a molecular layer consisting of C8, Amino, and Carboxy, respectively, according to embodiments of the invention;

FIGS. 9A, 9B, and 9C depict the distributions of dissolution voltage of junctions made having a molecular layer consisting of C8, C12, and C16, respectively, according to embodiments of the invention;

FIG. 10 shows the distributions of dissolution voltage of an Amino junction according to an embodiment of the invention;

FIG. 11 shows the switching I-V measurements of a representative Amino molecular junction according to embodiments of the invention;

FIGS. 12A and 12B depict the distributions of the transition voltage of silver/Hydroxy/gold and a silver/Hydroxy/nickel junction, respectively, according to embodiments of the invention;

FIGS. 13A and 13B depict the distributions of dissolution voltage of silver/Hydroxy/gold junction and a silver/Hydroxy/nickel junctions, respectively, according to embodiments of the invention;

FIG. 14 depicts a method for fabricating large-scaled, well-ordered nanoporous alumina substrates according to an embodiment of the invention;

FIG. 15 is a topographic image of an aluminum surface after electropolishig according to an embodiment of the invention.

Figure 16:
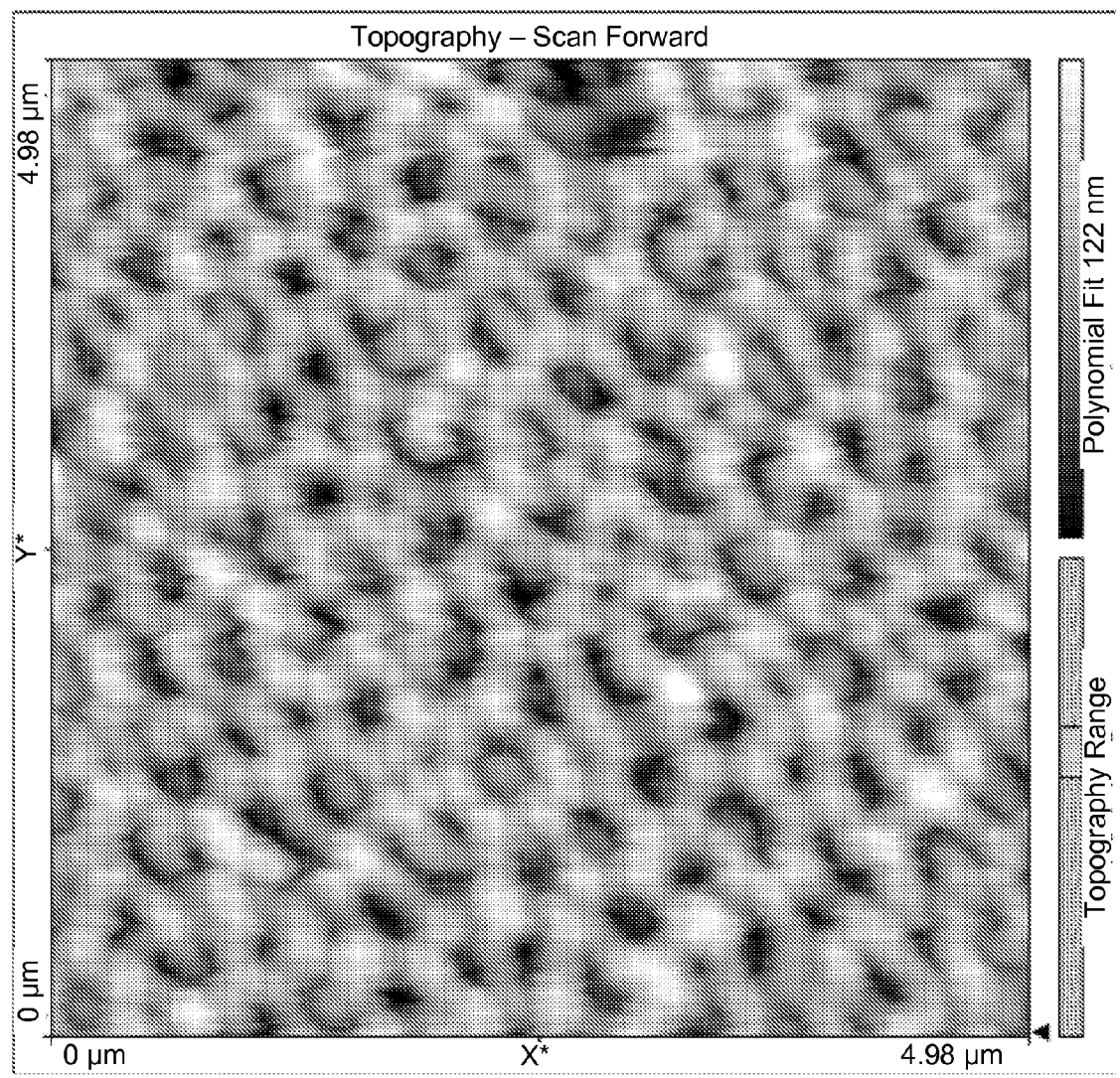
Figure 17:
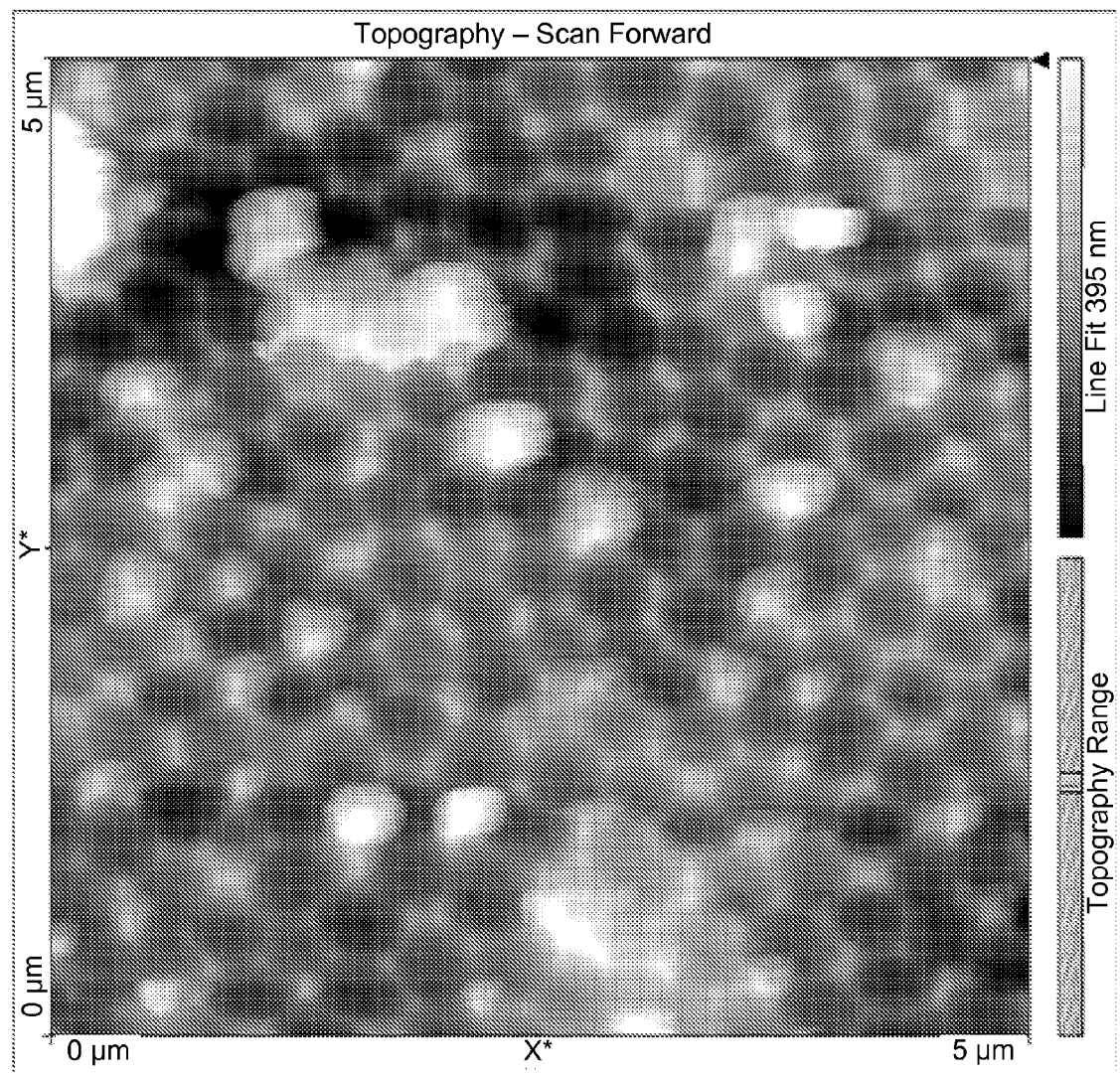
Figure 18:
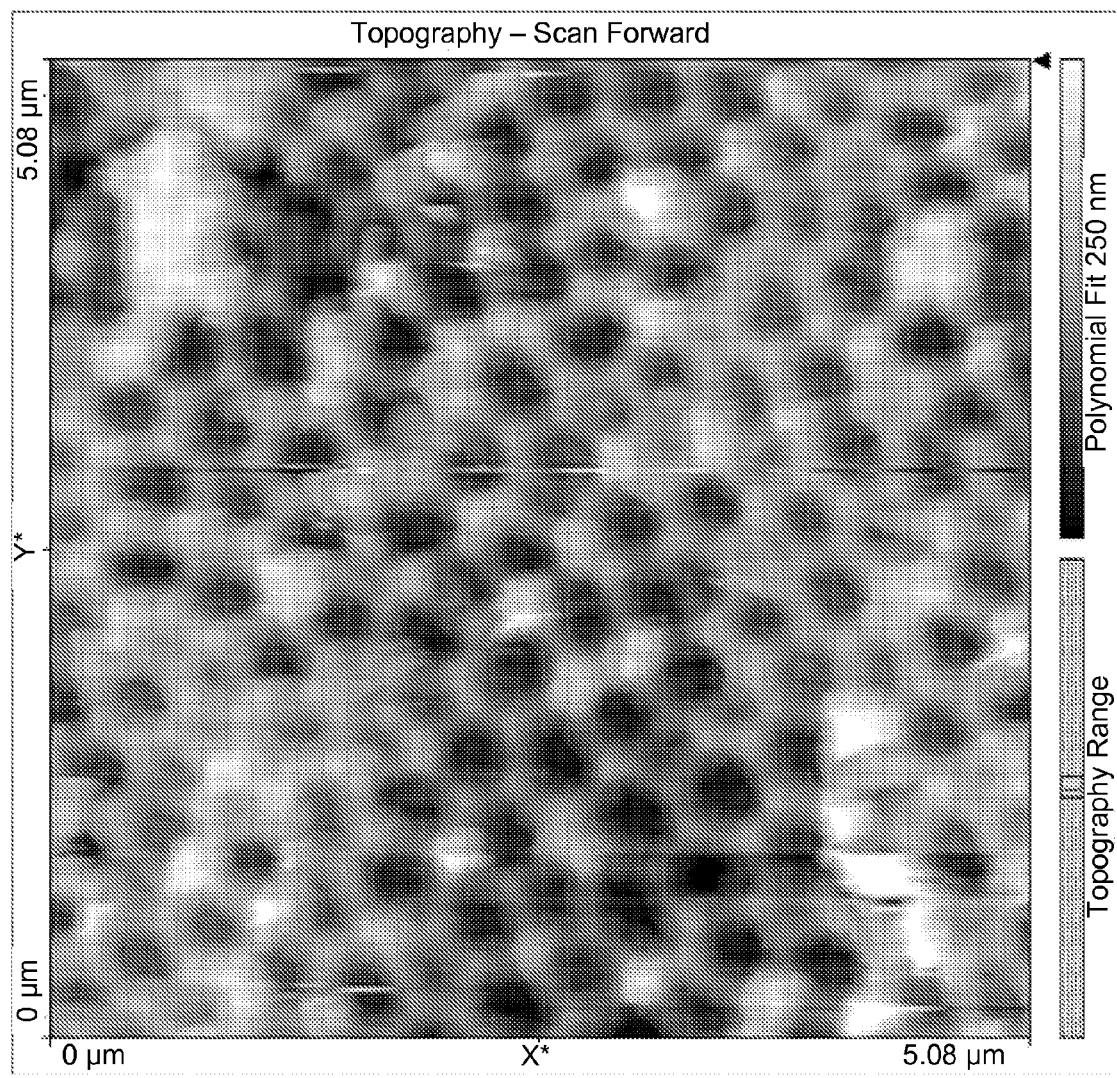
Figure 19:
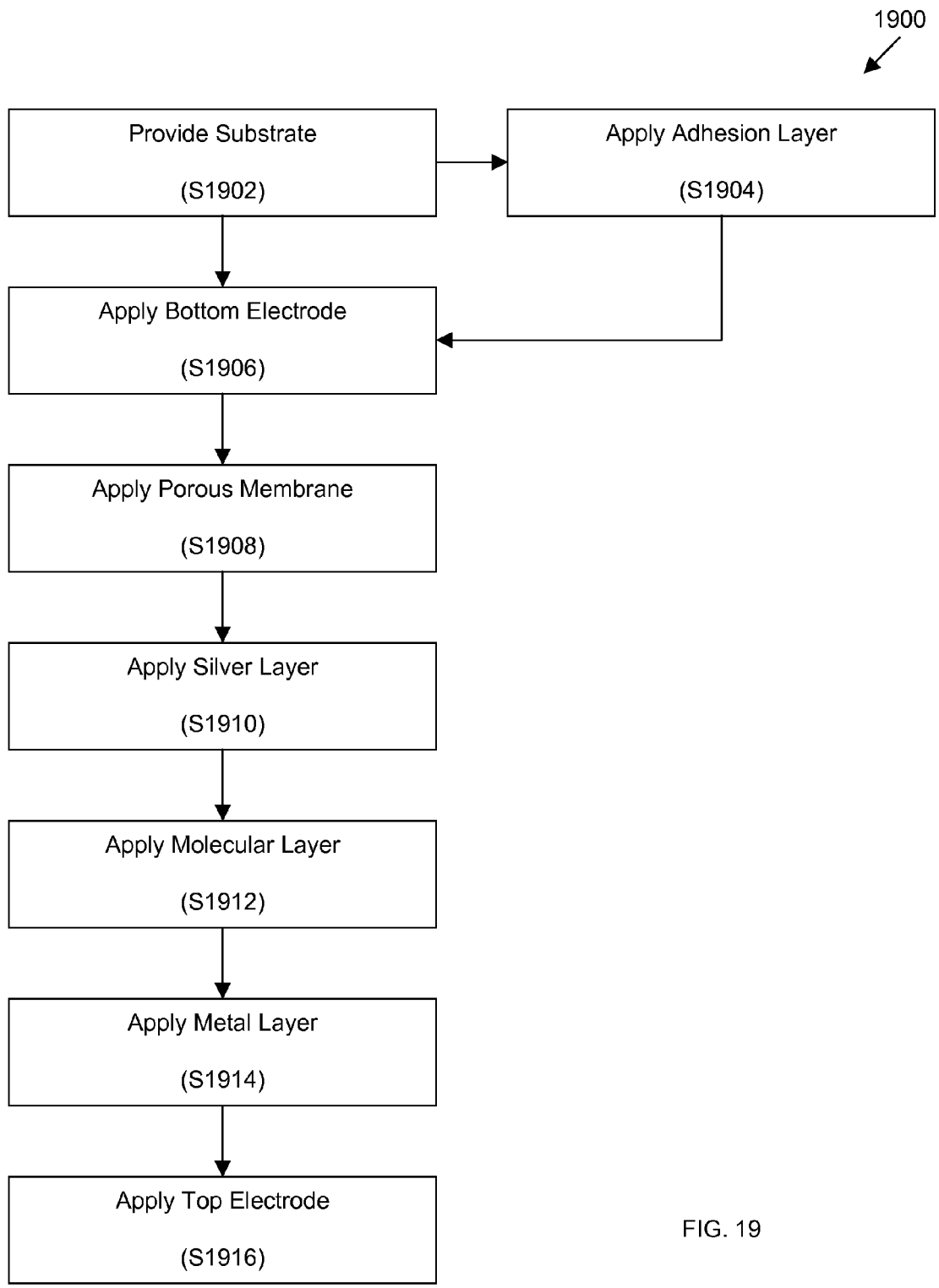

FIG. 16 is a topographic image of an aluminum surface after electropolishing and three minute of anodization according to an embodiment of the invention;

FIG. 17 is a topographic image of an aluminum surface after removal of the anodized aluminum layer according to an embodiment of the invention;

FIG. 18 is a topographic image of an anodized aluminum surface treated with an electropolish process, a three-minute anodization process, a phosphochromic acid etch, and a subsequent twenty minute anodization according to one embodiment of the invention;

FIG. 19 depicts a method of fabricating a memory device according to one embodiment of the invention; and FIGS. 20A-20H depicts a memory device in various stages of fabrication according to one embodiment of the invention.

DEFINITIONS

The instant invention is most clearly understood with reference to the following definitions:

As used in the specification and claims, the singular form "a," "an," and "the" include plural references unless the context clearly dictates otherwise.

Unless specifically stated or obvious from context, as used herein, the term "about" is understood as within a range of normal tolerance in the art, for example within 2 standard deviations of the mean. About can be understood as within 10%, 9%, 8%, 7%, 6%, 5%, 4%, 3%, 2%, 1%, 0.5%, 0.1%, 0.05%, or 0.01% of the stated value. Unless otherwise clear from context, all numerical values provided herein are modified by the term about.

As used in the specification and claims, the terms "comprises," "comprising," "containing," "having," and the like can have the meaning ascribed to them in U.S. patent law and can mean "includes," "including," and the like.

Ranges provided herein are understood to be shorthand for all of the values within the range. For example, a range of 1 to 50 is understood to include any number, combination of numbers, or sub-range from the group consisting 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 (as well as fractions thereof unless the context clearly dictates otherwise).

Unless specifically stated or obvious from context, as used herein, the term "or" is understood to be inclusive.

A "metal" shall be defined as a chemical element characterized by high electrical conductivity. Exemplary metals include, but are not limited to, silver, gold, copper, platinum, nickel, zinc, cadmium, titanium, chromium, iron, cobalt, palladium, tungsten, and the like A "thin film" shall be defined as a layer of material having a thickness between a fraction of a nanometer and several micrometers. For example, a thin film can have a thickness of: between about 0 nm and about 50 nm, between about 50 nm and about 100 nm between about 100 nm and about 150 nm, between about 150 nm and about 200 nm, between about 200 nm and about 250 nm, between about 250 nm and about 300 nm, between about 300 nm and about 350 nm, between about 350 nm and about 400 nm, between about 400 nm and about 500 nm, between about 500 nm and about 1,000 nm, and the like. A "thin film deposition technique" shall be defined as any technique suitable for depositing a thin film as defined and described herein. Examples of thin film deposition techniques include plating techniques (e.g., electrodeposition), chemical solution deposition (CSD), chemical vapor deposition (CVD), plasma-enhanced chemical vapor deposition (PECVD), physical vapor deposition (PVD), sputtering, pulsed laser deposition (PLD), cathodic arc deposition, and the like.

Description Of The Invention

Various aspects of the invention provide memory devices, methods of storing and reading data, and silver/molecular-layer/metal (SMM) junctions.

SMM Junctions

Figure 1C:
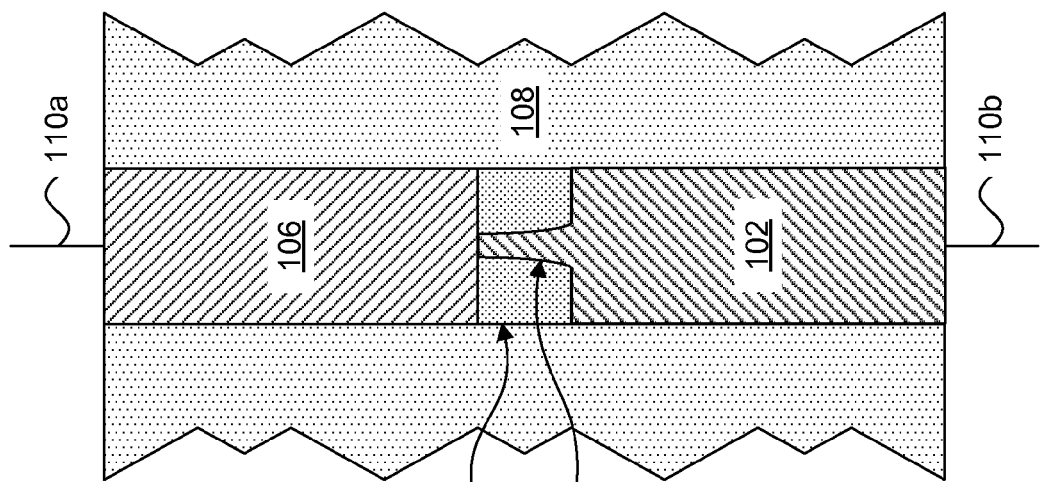
FIGS. 1A-1C depicts a cross section of a silver/molecular-layer/metal (SMM) junction according to one embodiment of the invention.
Figure 1B:
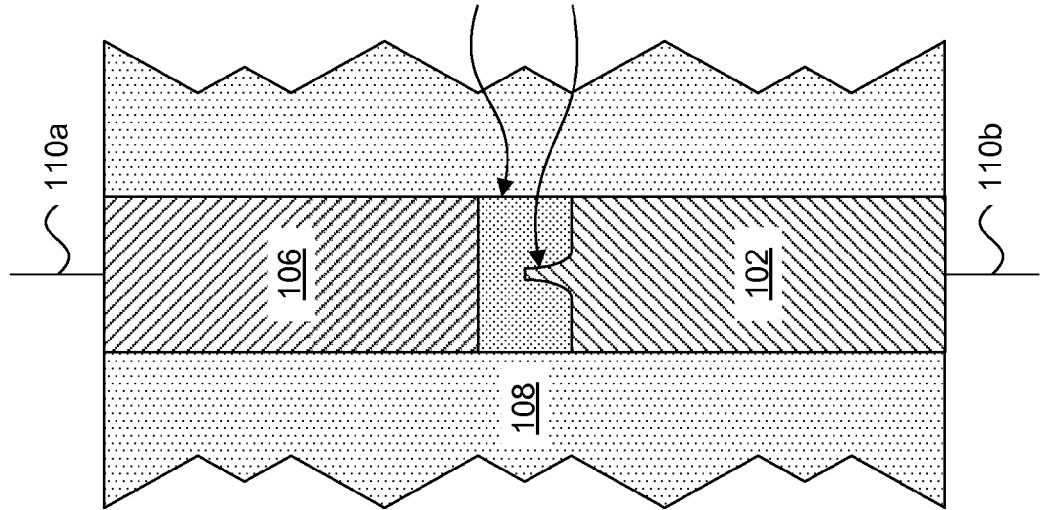
Figure 1A:
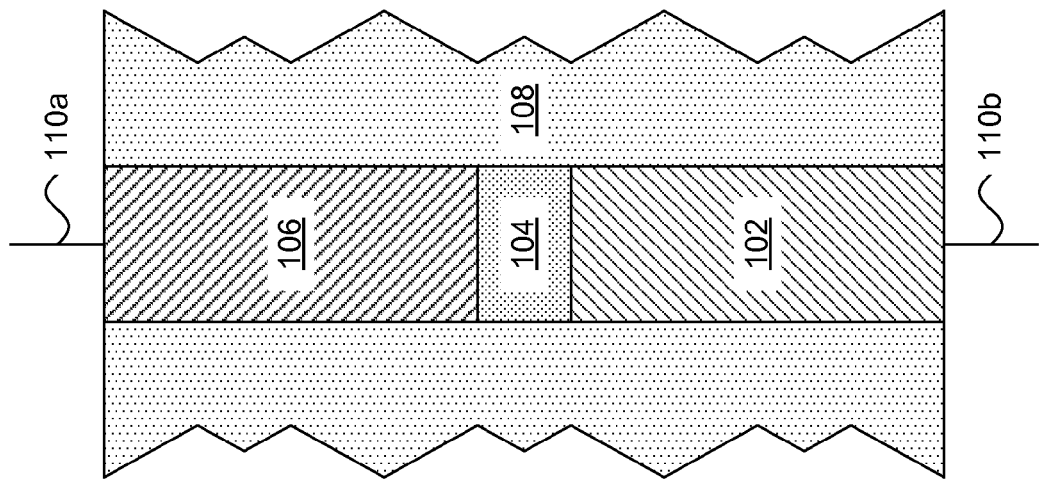

Referring now to FIGS. 1A-1C, a cross section of an SMM junction 100 according to one embodiment of the invention is depicted. The SMM junction 100 consists of a silver layer 102, a molecular layer 104, and a metal layer 106. SMM junction 100 can be formed within a substrate 108 as discussed herein. Silver layer 102 and metal layer 106 can be coupled to a circuit by leads 110a, 110b.

SMM junction 100 can be formed within a variety of substrates 108 such as dielectrics, semiconductors, and the like. In some embodiments, substrate 108 is a naturally porous membrane. For example, substrate 108 can be an aluminum oxide membrane-based filter paper, such as commercially available filter paper having a pore diameter of about 200 nm. Such paper has a pore density approaching about 1 billion pores per square centimeter and has an average thickness of about 60 micrometers. Although the pores are not uniformly distributed, the density of junctions will be sufficient to achieve a memory density on the order of hundreds of megabytes per square centimeter even if only half of the pores are used. The cost of such a device is anticipated to be lower than any currently available memory device.

In another example, the substrate 108 is an anodized metallic oxide film, for example, aluminum oxide, titanium oxide, tantalum oxide, and the like. In yet another example, the substrate 108 is polymer (e.g., thermoset polymers, thermoplastic polymers, polycarbonates, and the like) having one or more holes.

In some embodiments, the holes range from about 10 nanometers in diameter to 10 micrometers in diameter.

The holes can be preformed within the substrate or can be created with nuclear etching, chemical means (e.g., chemical etching, photochemical etching, and the like), and/or electrical means (e.g., electrical discharge machining, electron-beam machining and the like). Suitable polymer substrates are available, for example, from GE Osmonics, Inc. of Minnetonka, Minn. Suitable filters are available from Sterlitech Corporation of Kent, Wash. and under the NUCLEPORE® trademark from Whatman Inc. of Florham Park, N.J.

Silver layer 102 can include elemental silver, silver sulfide, and the like.

Molecular layer 104 serves as a spacer layer that isolates silver layer 102 and metal layer 106, but still allows a metal filament to bridge across the molecular layer 104. Molecular layer 104 can be any insulative material. In some embodiments, molecular layer 104 includes thiols such as monothiolated oligo(phenylene-ethynylene), octanethiol ($C_8SH$), decanethiol ($C_{10}SH$), dodecanethiol ($C_{12}SH$), hexadecanethiol ($C_{16}SH$), octadecanethiol ($C_{18}SH$), thiols having an amino functional group (e.g., 8-amino-1-octanethiol), thiols having an carboxyl functional group (e.g., 7-carboxy-1-heptanethiol), thiols having an hydroxyl functional group (e.g., 8-hydroxy-1-octanethiol), and the like. In some embodiments, the molecular layer 104 is a monolayer (i.e., a layer that is one molecule thick).

In some embodiments, metal layer 106 can be a metal such as silver, gold, copper, platinum, nickel, zinc, cadmium, titanium, chromium, iron, cobalt, palladium, tungsten, and the like.

SMM junction 100 can be fabricated through a variety of methods. For example, silver layer 102, molecular layer 104, and/or metal layer 106 can be applied to substrate 108 with known techniques such as electrodeposition, evaporation, physical vapor deposition (PVD), chemical vapor deposition (CVD), and the like. In some embodiments, molecular layer 104 includes materials capable of forming a self-assembled layer on noble metals such as silver. Such materials include thiolated molecules and other molecules terminating in isocyanide, thiolcyanide, and disulfide groups.

In FIG. 1A, SMM junction 100 is in an "OFF" state. If low voltage is applied across SMM junction 100, little (if any) electricity will flow across the molecular layer 104.

In FIG. 1B, a voltage exceeding a threshold for the SMM junction 100 (e.g., about 1 volt) is applied to the junction 100. This voltage causes a filament 112 of silver molecules to grow from the silver layer 102 across molecular layer 104 toward metal layer 106.

In FIG. 1C, the filament 112 (or "nano-weld") is completed. At this point, electricity applied across SMM junction 100 (even electricity below the threshold required to form the filament 112) will flow through the junction 100.

Figure 1D:
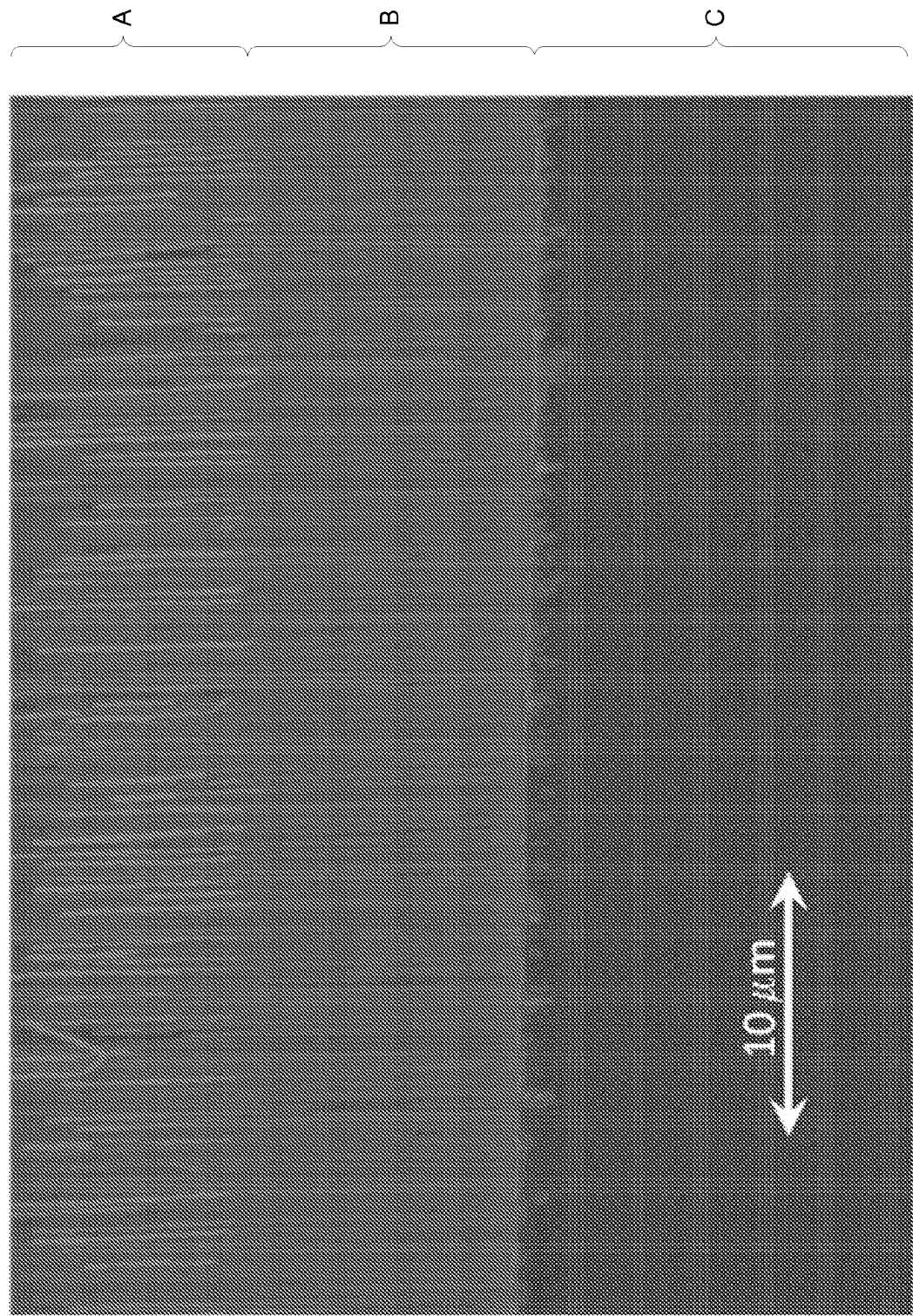
FIG. 1D is a scanning electron micrograph (SEM) image of bi-metal nanowires grown in alumina nanopores.

FIG. 1D is a scanning electron micrograph (SEM) image of bi-metal nanowires grown in alumina nanopores. Region A is the silver layer 102. Region B is a metal layer 106 (gold in this example. Region is a sample holder used to hold the membrane in place within the SEM. Both the silver nanowelds and the molecular layer are invisible.

Memory Devices

Figure 2:
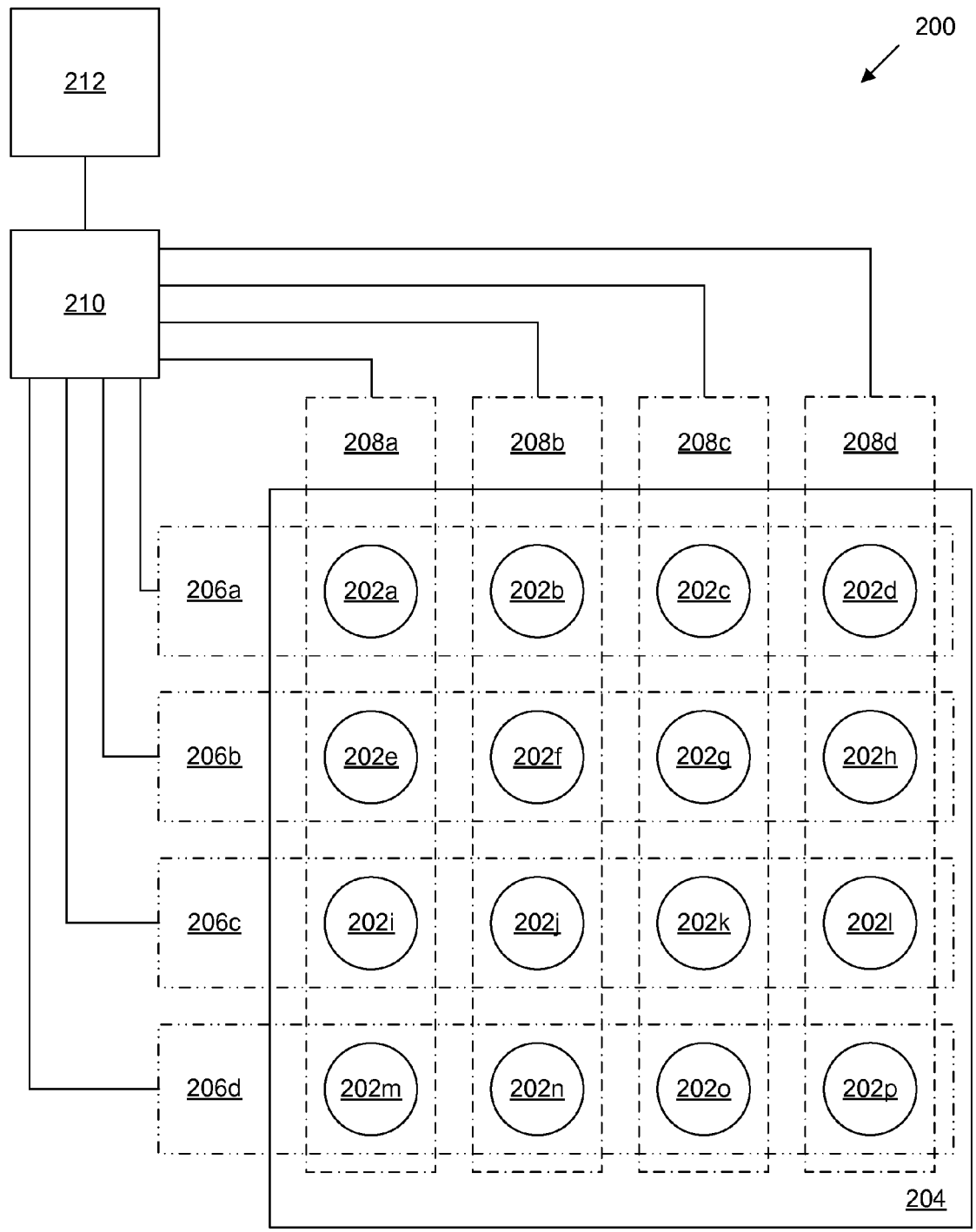
FIG. 2 depicts a memory device according to one embodiment of the invention.

Referring now to FIG. 2, a plurality of SMM junctions 202 can be arranged in a substrate 204 to form a memory device 200. SMM junctions 202 can be electrically coupled to electrodes 206, 208. Electrodes 206, 208 can be arranged on opposite sides of substrate 204, and therefore on opposite ends of SMM junctions 202. Electrodes 206, 208 can be arranged in a crossbar geometry as discussed in U.S. Patent Application Ser. No. 2008/0067555; Nina I. Kovtyukhova & Thomas E. Mallouk, "Nanowires as Building Blocks for Self-Assembling Logic & Memory Circuits," 8(19) Chem. Eur. J. 4354-63 (2002); and Wei Lu & Charles M. Leiber, "Nanoelectronics from the bottom up," 6 Nature Materials 841-50 (2007).

Memory device 200 can include a control device 210 in communication with electrodes 206, 208. Control device 210 can individually write to and/or read from particular SMM junctions 202. For example, to read SMM junction 202$j$, control device 210 can apply a low voltage to electrode 208$b$ while monitoring voltage on electrode 206$c$. If voltage is detected, SMM junction 202$j$ is actuated to the "ON" state. If voltage is not detected, SMM junction 202$j$ is actuated to the "OFF" state.

Control device 210 can be further configured to calculate the conductance of one or more SMM junction 202 according the formula $$C = \frac{I}{V},$$

where C is the conductance of the SMM junction 202, I is the electric current that flows through the SMM junction 202, and V is the voltage. While the particular conductance across an SMM junction 202 will vary in response to the particular materials 102, 104, 106, 108 used and the dimensions of the materials, the ratio in conductance between an SMM junction 202 in the ON and OFF states is generally over about 100,000.

Memory device 200 can also include an interface 212 in communication with control device 210 and configured for communicative coupling with an external device (not depicted).

In some embodiments, interface 212 is a wired interface. For example, interface 212 can include the appropriate hardware and/or software to implement one or more of the following communication protocols: Universal Serial Bus (USB), USB 2.0, IEEE 1394, Peripheral Component Interconnect (PCI), Ethernet, Gigabit Ethernet, and the like. The USB and USB 2.0 standards are described in publications such as Andrew S. Tanenbaum, Structured Computer Organization §3.6.4 (5th ed. 2006); and Andrew S. Tanenbaum, Modern Operating Systems 32 (2d ed. 2001). The IEEE 1394 standard is described in Andrew S. Tanenbaum, Modern Operating Systems 32 (2d ed. 2001). The PCI standard is described in Andrew S. Tanenbaum, "Modern Operating Systems" 31 (2d ed. 2001); Andrew S. Tanenbaum, Structured Computer Organization 91, 183-89 (4th ed. 1999). The Ethernet and Gigabit Ethernet standards are discussed in Andrew S. Tanenbaum, Computer Networks 17, 65-68, 271-92 (4th ed. 2003).

In other embodiments, interface 212 is a wireless interface. For example, the interface 212 can include the appropriate hardware and/or software to implement one or more of the following communication protocols: Bluetooth, IEEE 802.11, IEEE 802.15.4, and the like. The Bluetooth standard is discussed in Andrew S. Tanenbaum, Computer Networks 21, 310-17 (4th ed. 2003). The IEEE 802.11 standard is discussed in Andrew S. Tanenbaum, Computer Networks 292-302 (4th ed. 2003). The IEEE 802.15.4 standard is described in Yu-Kai Huang & Ai-Chan Pang, "A Comprehensive Study of Low-Power Operation in IEEE 802.15.4" in MSWiM'07 405-08 (2007).

Enhanced SMM Junctions

Conventional SMM junctions require multiple cycles of oscillating voltage in order to permanently set an SMM junction the "ON" state. However, the chemistry of SMM junctions can be modified to substantially reduce the write time of an SMM memory device.

SMM junctions are actuated by an electrochemical process that is enhanced by the humidity of the local environment. Accordingly, the rate of filament growth can be increased by incorporating water containing molecules such as metal-perchlorate salts into the molecular layer of an SMM junction. Suitable metal-perchlorate salts include nickel(II) perchlorate hexahydrate and copper(II) perchlorate hexahydrate.

Additionally or alternatively, the metal layer 106 can include a metal that has a high affinity for silver (e.g., copper or gold) to increase the probability of permanent filament formation.

Both the incorporation of metal-perchlorate salts and the use of metals with a high affinity for silver not only reduce the write time for the SMM junction, but can also reduce the threshold voltage required to actuate the SMM junction to the "ON" state, thereby lowering the power consumption of memory device 200.

Methods of Storing Data and Reading Data

Referring now the FIG. 3, a method 300 of storing data is provided. In step S302, data is received from an external device. This data can be encoded in binary.

In step S304, electricity exceeding the threshold voltage is applied across a subset of SMM junctions to store the data. For example, referring to FIG. 2, the number 1944 (represented in binary as 0000011110011000) could be encoded in memory device 200 by actuating SMM devices 202d, 202e, 202h, 202i, 202j, and 202k. SMM junctions can be actuated sequentially in order to avoid cross-talk from electricity applied across multiple electrodes. As discussed herein, electricity can, in some embodiments, be applied across an SMM junction a plurality of times to promote permanent filament formation.

FIG. 4 depicts a method 400 of reading data from a memory device including a plurality of SMM junctions. In step S402, a request for data is received from an external device. In step S404, voltage less than the threshold voltage is applied across the SMM junctions. Voltage can be applied to the SMM junctions sequentially to avoid cross-talk across multiple electrodes. In step S406, the conductance of each SMM junction is calculated as discussed herein. In step S408, a data string is returned. In some embodiments, the data string contains a "1" for each SMM junction that exhibits a high conductance and a "0" for each SMM junction that exhibits a low conductance.

Further Optimization of SMM Junctions

In order to better characterize and optimize the mechanism for switching in the SMM junctions, experiments were performed to study changes in the switching behavior as a function of molecular length, functional group, and type of metal used in the junction.

As depicted in FIG. 5, the experiments studied the performance of octanethiol (referred to herein as "C8"), dodecanethiol (referred to herein as "C12"), hexadecanethiol (referred to herein as "C16"), 8-amino-1-octanethiol (referred to herein as "Amino"), 7-carboxy-1-heptanethiol (referred to herein as "Carboxy"), and 8-hydroxy-1-octanethol (referred to herein as "Hydroxyl") as a molecular layer. Unless otherwise stated, all measurements discussed herein were performed on silver/molecular-layer/gold junctions, and the abbreviations provided above and in FIG. 5 are used to identify the molecular layer herein.

Figure 6:
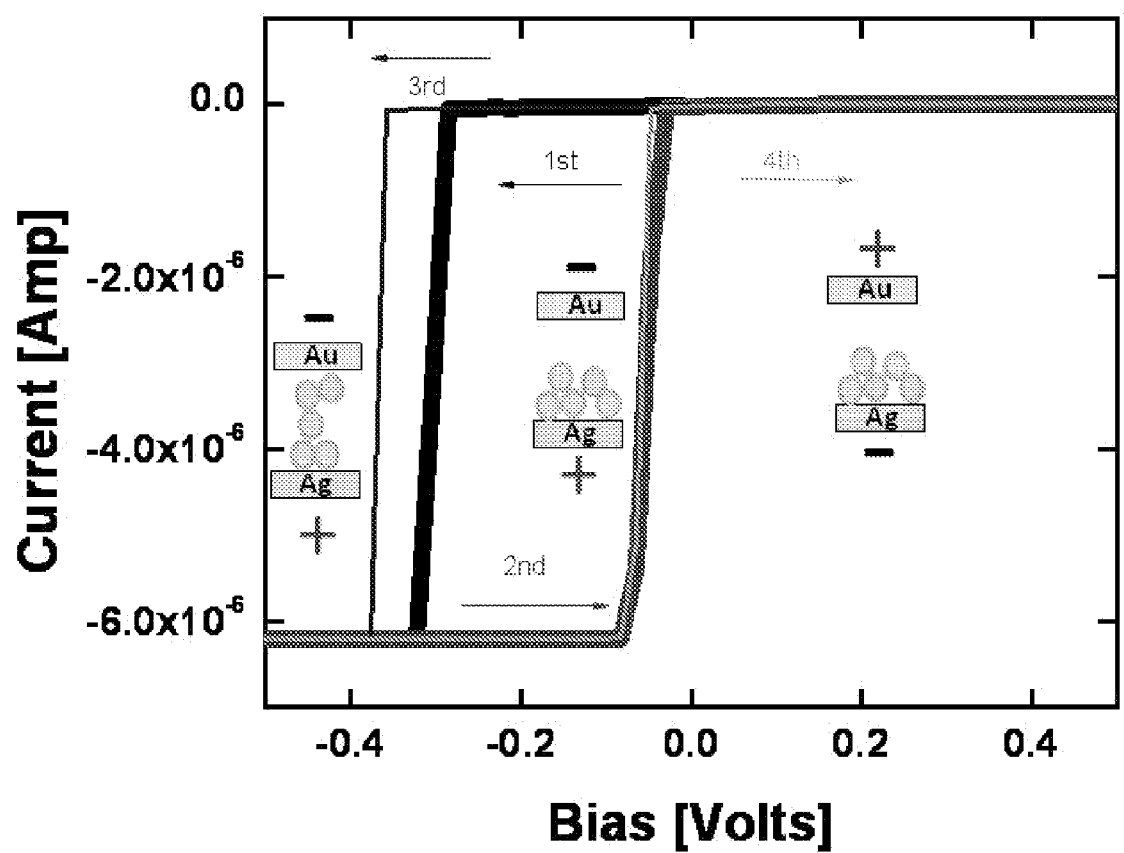
FIG. 6 depicts the switching current-voltage (I-V) measurements of a representative C8 junction according to one embodiment of the invention.

FIG. 6 depicts the switching current-voltage (I-V) measurements of a representative C8 junction. The voltage at which the conductance of the junction discontinuously increases is referred to herein as the "transition voltage" and the voltage at which the conductance of the junction discontinuously decreases is referred to herein as the "dissolution voltage." The discontinuous increase in conductance signifies the bridging of silver metal filament across the molecular junction and the discontinuous decrease in conductance signifies the breaking of the silver bridge. Silver metal filaments are formed across the molecular layer when Ag+ ions migrate from the silver surface to the other metal surface.

Effect of Molecule Length on Switching Behavior

FIGS. 7A, 7B, and 7C depict the distribution of transition voltages of junctions made with a molecular layer consisting of C8, C12, and C16, respectively. The distributions of transition voltages demonstrate a systematic change in the average transition voltage <V> from −0.3V to −0.4V to −1.1V, respectively, as depicted in FIGS. 7A, 7B and 7C. The variations in thickness as measured by ellipsometry between these molecular layers are 1.8 nm, 2.4 nm, and 3.0 nm for the C8, C12, and C16 materials, respectively. As the thickness of the junction increases by 33% when the molecular layer changes from C8 to C12, the average transition voltage <V> increases by 33%. However, as the thickness of the junction increases by 25% when the molecular layer changes from C12 to C16, the average transition voltage <V> increases by over 100%. Furthermore, the standard deviation of the distribution of transition voltage around the average <V> for the C16 molecular junction is also more than twice as large as that of the C12 and C8 junctions.

The increase in average transition voltage <V> with increased molecular layer thickness suggests that the silver filament formation process is related to the magnitude of electric field across the junction. Because the magnitude of the electric field in the junction is equal to the voltage across the junction divided by the junction's thickness, the observation that as the junction thickness increases, the average transition voltage <V> increases is consistent with an electric-field-driven process. The nonlinear increase in the average transition voltage <V> and the distribution width when the molecular layer changes from C12 to C16 suggest that the magnitude of the tunneling current within the molecular junction could also play a role in the silver filament formation and dissolution process. The magnitude of the tunneling current within the molecular junction decreases exponentially with junction's thickness.

Effect of Functional Group on Switching Behavior

FIGS. 8A, 8B, and 8C compare the transition voltage distribution of C8, Amino, and Carboxy junctions, respectively. All three molecular layers have very similar thickness. The Amino junctions have a ($NH_2^-$) functional group and a lower average transition voltage <V> than the C8 junctions (which are terminated by a neutral methyl group). On the other hand, the Carboxy junctions have a ($COOH^+$) functional group and a higher average transition voltage <V> when compared with the C8 junctions.

The shift in the average transition voltage <V> between the three molecular junctions is consistent with the silver filament formation process where Ag+ ions are transported along the electric field in the junction. The ($NH_2^-$) functional group attracts the $Ag^+$ ions and the ($COOH^+$) functional group repels the $Ag^+$ ion. The usage of different molecular layers with different functional groups also changes the distribution of dissolution voltage.

Effect of Molecule Length and Functional Group on Dissolution Voltage

FIGS. 9A, 9B, and 9C show that the distributions of dissolution voltage of junctions made with molecular layers consisting of C8, C12, and C16 are essentially identical.

FIG. 10 shows the distributions of dissolution voltage of an Amino junction, and FIG. 11 shows the switching I-V measurements of a representative Amino molecular junction.

Although the dissolution voltages of the C8, C12, and C16 molecular junctions are of the same polarity as the transition voltages (negative), the majority of the dissolution voltage for the Amino junction are in the opposite polarity (i.e., positive). The implication of this observation to memory application is that SMM junctions having negative transition voltages (e.g., SMM junctions having a C8, C12, or C16 molecular layer) are particularly advantageous for use in dynamic random access memory (DRAM) applications while SMM junctions having negative transition voltages (e.g., SMM junctions having an Amino molecular layer) are particularly advantageous non-volatile (e.g., static) memory applications.

Effect of Metal Layer on Switching Behavior

FIGS. 12A and 12B depict the distribution of the transition voltage of a silver/Hydroxy/gold junction and a silver/Hydroxy/nickel junction, respectively. FIGS. 13A and 13B depict the distribution of dissolution voltage of a silver/Hydroxy/gold junction and a silver/Hydroxy/nickel junction, respectively.

In changing from gold to nickel, the average transition voltage <V> of the hydroxyl junction increases from −0.25V to −0.8V, and the standard deviation of the distribution increases from 0.1V to 0.3V. The distribution of dissolution voltage between the two junctions also changes. The magnitude of the average dissolution voltage increases by 0.07V when changing from a nickel-based junction to a gold-based junction. The difference in work function between gold and silver is 0.37V and the difference in work function between nickel and silver is 0.28V, so in going from a gold-based to a nickel-based junction, the work function differences in the metals decreases by 0.09V. The observed increase in the magnitude of the average dissolution voltage is seem to be correlated to the drop in work function differences between the metals used in forming the junction.

In summary, the average transition voltage <V> can be increased as a function of increasing thickness of the molecular layer in the silver/molecular-layer/metal junction at for SMM junctions having molecular layers within the tunneling length scale (<10 nm). (SMM junctions having molecular layers above the tunneling length scale would likely form larger filaments that are more dendritic under mechanisms that are more similar to those seen in macroscopic junctions.) The relationship between the average transition voltage <V> and molecular layer thickness is confounded by changes in the tunneling current through the junction as the thickness changes.

The results herein suggest that the dielectric property of the molecular layer also play a significant role in determining switching behavior of the molecular junction. The charge state of the functional group on the molecular layer also changes the average transition voltage <V>, such that the presence of more-negatively-charged moiety results in less negative average transition voltage <V> and average dissolution voltage. Also, replacing gold with nickel in forming the molecular junction lowers the electrochemical potential within the junction, which results in an increase in the magnitude of the average dissolution voltage.

Fabrication of Alumina Substrates

Referring now to FIG. 14, another aspect of the invention provides a method 1400 for fabricating large-scale, well-ordered nanoporous alumina substrates.

In step S1402, a piece of aluminum is provided. In the example depicted herein, the aluminum is 150 μm thick. However the aluminum can be any thickness, including, for example, between about 0 μm and about 50 μm, between about 50 μm and about 100 μm, between about 100 μm and about 150 μm, between about 150 μm and about 200 μm, between about 200 μm and about 250 μm, between about 250 μm and about 300 μm, between about 300 μm and about 350 μm, between about 350 μm and about 400 μm, between about 400 μm and about 450 μm, between about 450 μm and about 500 μm, and the like. The duration of the polishing and/or andodization steps S1404 and S1406 can be adjusted to reflect the thickness of the aluminum (e.g., by shortening the durations specified herein for thinner pieces.

In step S1404 surface of the aluminum is electropolished. Various solutions can be used to electropolish the aluminum surface. For example, the solution can include about 70% ethanol, about 13.8% water, about 10% butyl cellosolve, and about 6.2% perchloric acid by volume. Electropolishing can be performed in a home build electrochemical cell in which the anode of the cell is connect to the aluminum and the cathode of the cell is connected to a stainless steel block, and the aluminum and the stainless steel are separated by the electropolish solution.

In some embodiments, a multi-step electropolishing process is employed. In substep S1404a, the voltage between the anode and cathode begins at 0V and increases at a rate of about 1 V/sec until a voltage of about 60V is reached. In substep S1404b, the voltage is maintained at about 60V for about 5.5 minutes. After about 5.5 minutes, the voltage is again set to 0V in substep S1404c. Immediately after the voltage is set to 0V, the voltage is again increased in step S1404d at a rate of about 1V/sec until the voltage is reaches 40V. The voltage is maintained at about 40V for about 5.5 minutes in substep S1404e. The electropolishing process is completed after the voltage is returned to 0V in S1404f. During the first portion of the polish (substeps S1404a-1304c), the roughness of the aluminum surface is dramatically reduced and the second portion of the polish (substeps S1404d-1304f) imparts a semi-ordered pattern on the aluminum surface which enhances the ordering for the anodization process as depicted in FIG. 15.

After electropolishing the aluminum surface, the aluminum is anodized in step S1406. The duration of anodization can vary. For example, the aluminum can be anodized for 1-2 minutes, 2-3 minutes, 3-4 minutes, 4-5 minutes, 5-6 minutes, 6-7 minutes, 7-8 minutes, 8-9 minutes, 9-10 minutes, 10-15 minutes, 15-20 minutes, 20-30 minutes, and the like. In one embodiment, the electropolished aluminum can be anodized for about three minutes using a 0.35M oxalic acid solution at a constant current density of about 0.15 A/cm². Three minutes of anodization results in semi-ordered pores in the aluminum that are approximately 50 nm deep as depicted in FIG. 16. The average pore size is about 150 nm in diameter. Due to the mechanical tension of the anodization process, the ordering of the nanopores increases as the pores become deeper.

In order to increase the ordering of the nanopores formed in the aluminum, the anodized aluminum formed in step S1406 can be removed in step S1408. The anodized aluminum can be removed, for example, using a solution of about 15% chromic acid, about 8% phosphoric acid, and about 77% water by volume. All of the anodized aluminum is removed after submersion in the solution for about 50 minutes at about 150° C. Mechanical dimples corresponding to the ordering of the bottom of the anodized aluminum are left on the aluminum surface after the phosphochromic acid etch as depicted in FIG. 17.

The anodization (S1406) and acid etching (S1408) steps can optionally be repeated several times to achieve the desired nanopores ordering. For example, step S1406 and S1408 can be repeated 2 times, 3 times, 4 times, 5 times, 6 times, 7 times, 8 times, 9 times, 10-15 times, 15-20 times, 20-30 times, 30-40 times, 40-50 times, 50-60 times, 60-70 times, 70-80 times, 80-90 times, 90-100 times, and the like.

FIG. 18 depicts the surface topography of an anodized aluminum surface formed by a three minute anodization, followed by a phosphochromic acid etch, and followed by a subsequent twenty minute anodization.

Fabrication of Memory Devices

Referring now to FIG. 19 (described in the context of FIG. 20), a method 1900 of fabricating a memory device is provided.

In step S1902, a substrate 2002 is provided. The substrate 2002 can be any material capable of receiving the memory device described herein. The substrate 2002 can be substantially rigid or substantially flexible. In some embodiments, the substrate 2002 is an electrically insulative material such as glass or silicon.

In step S1904, an adhesion layer 2004 is optionally applied to the substrate 2002. The adhesion layer 2004 can be any material capable of bonding with the substrate 2004 and the bottom electrode 2006. For example, a thin layer of chromium or titanium can be applied as an adhesion layer 2004 to the substrate 2002. The adhesion layer 2004 can be applied to the entire surface of the substrate 2002 or can be applied only to the regions in which the bottom electrode 2006 will be applied as discussed in step S1906. In some embodiments, the adhesion layer 2004 is a thin film, for example, a thin film having a thickness of about 10 nm. The adhesion layer 2004 can be applied using various thin film deposition techniques as discussed and defined herein.

In step S1906, a bottom electrode 2006 applied. The bottom electrode 2006 can optionally be applied over the adhesion layer 2004 applied in S1904. The bottom electrode 2006 is preferably an electrically-conductive material, for example, a metal such as gold. In some embodiments, the bottom electrode 2006 is a thin film, for example, a thin film having a thickness of about 20 nm. The bottom electrode 2006 can be applied using various thin film deposition techniques as discussed and defined herein. In some embodiments, the bottom electrode 2006 is a plurality of distinct paths of metal as depicted in FIG. 20. For example, the bottom electrode 2006 can consist of a plurality of substantially parallel strips of metal 2006a-2006d to form one half of a crossbar geometry as discussed herein.

In step S1908, a porous membrane 2008 is placed on top of the bottom electrode. The porous membrane 2008 can be a porous membrane as discussed herein. For example, the porous membrane 2008 can be an alumina-membrane-based filter paper, an etched polycarbonate membrane, an anodized metallic oxide film (e.g., an anodized metallic oxide film consisting of aluminum oxide, titanium oxide, tantalum oxide, and the like), and the like. Specifically, the porous membrane 2008 can be an aluminum oxide membrane prepared according to method 1400 as described herein in the context of FIG. 14. The porous membrane 2008 can be bonded to the bottom electrode 2006 by the natural adhesion between oxidized aluminum and metals such as gold, silver, copper, aluminum, or any other metal that naturally bonds to aluminum.

Figure 20A:
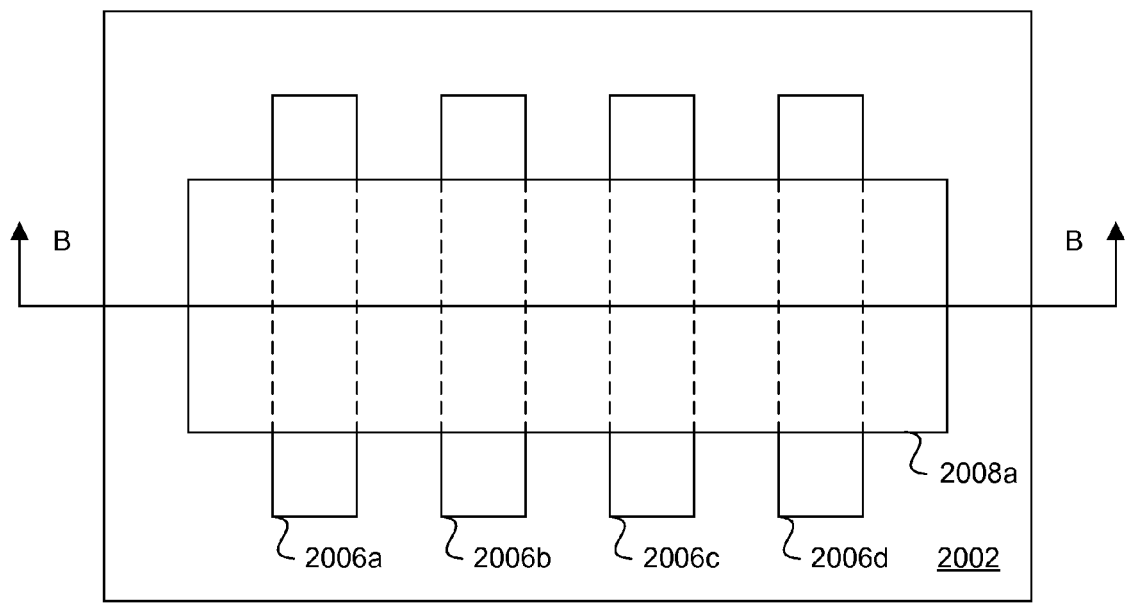
Figure 20B:
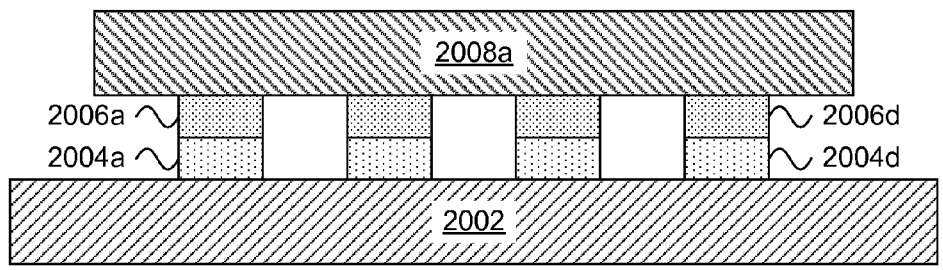
Figure 20C:
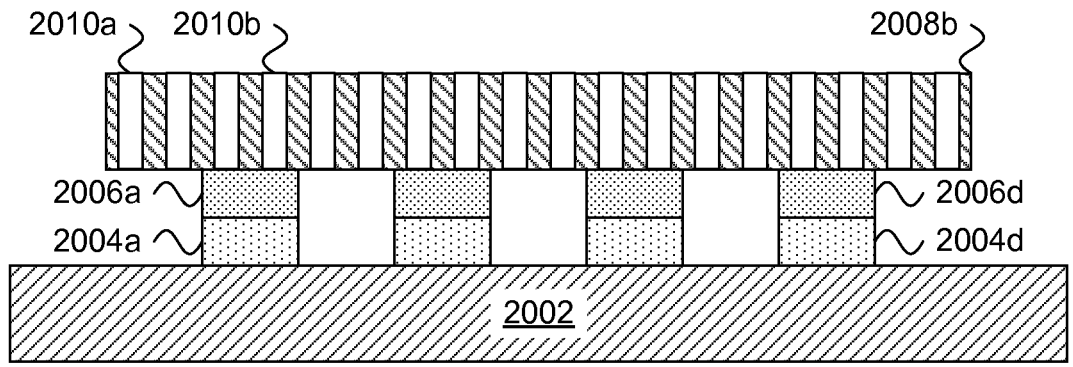
Figure 20D:
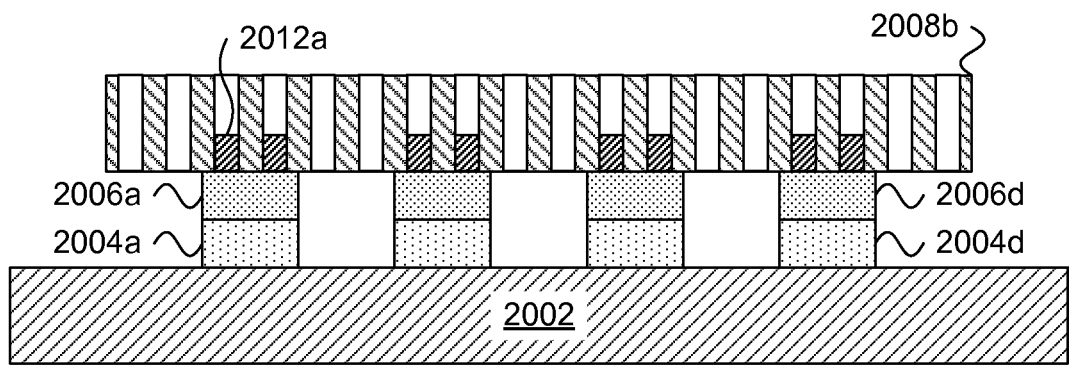
Figure 20E:
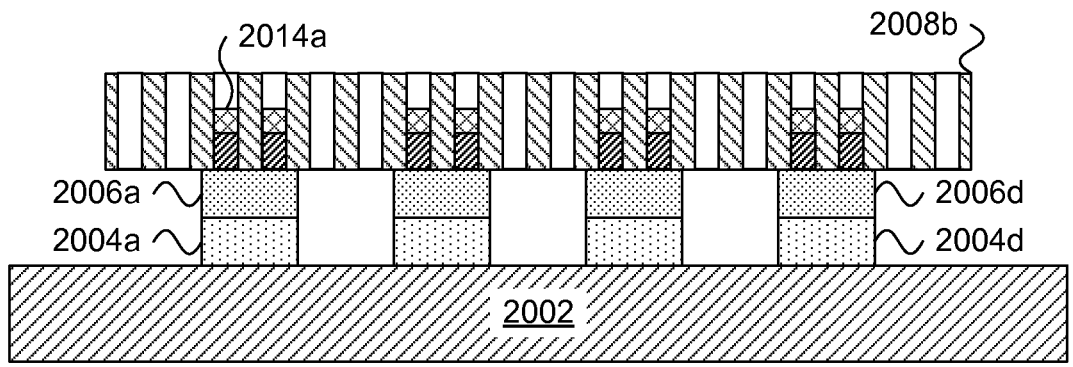
Figure 20F:
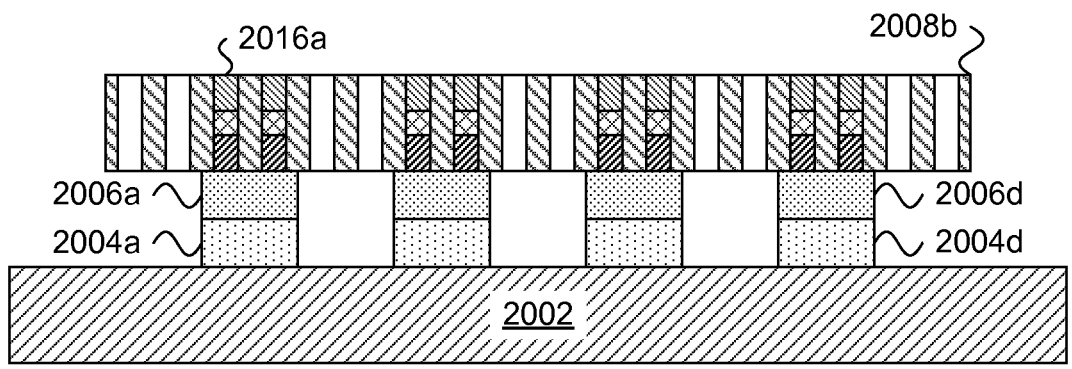

In some embodiments, the porous membrane 2008 is fabricated while bound to the bottom electrode 2006 and substrate 2002. For example, as depicted in FIGS. 20A and 20B, porous membrane 2008 can initially be a solid piece of aluminum 2008a and pores 2010 can be formed in situ, for example, using the method 1400 described herein to produce porous membrane 2008b as depicted in FIG. 20C.

In step S1910, a silver layer 2012 is applied within the pores of the porous membrane 2008. The silver layer 2012 can include elemental silver, silver sulfide, and the like as discussed herein in the context of FIG. 1. In some embodiments, the silver layer 2012 is a thin film. The silver layer 2012 can be applied using various thin film deposition techniques as discussed and defined herein. In some embodiments, the silver layer 2012 is applied to all pores 2010, i.e., including pores (e.g., pore 2010a) that are not in contact with bottom electrode 2006. In another embodiment, the silver layer 2012 is selectively applied to certain regions configured to couple the bottom electrode 2006 and the top electrode 2018. The silver layer can be selectively applied, for example, through use of a lithography mask.

In step S1912, the molecular layer 2014 is applied over the silver layer 2012 within the pores 2010 of the porous membrane 2008. The molecular layer 2014 can be any insulative material. In some embodiments, the molecular layer 2014 includes thiols such as monothiolated oligo(phenylene-ethynylene), octanethiol ($C_8SH$), decanethiol ($C_{10}SH$), dodecanethiol ($C_{12}SH$), hexadecanethiol ($C_{16}SH$), octadecanethiol ($C_{18}SH$), thiols having an amino functional group (e.g., 8-amino-1-octanethiol), thiols having an carboxyl functional group (e.g., 7-carboxy-1-heptanethiol), thiols having an hydroxyl functional group (e.g., 8-hydroxy-1-octanethiol), and the like. In some embodiments, the molecular layer 2014 is a thin film. The molecular layer 2014 can be applied using various thin film deposition techniques as discussed and defined herein. Molecular layer 2014 can be applied to all pores 2010 or to selective pores 2010 as discussed herein in the context of silver layer 2012.

In step S1914, a metal layer 2016 is applied within the pores of the porous membrane 2008 over the molecular layer 2014. In some embodiments, metal layer 2016 can be a metal. In some embodiments, the metal layer 2016 is a thin film. The metal layer 2016 can be applied using various thin film deposition techniques as discussed and defined herein. Metal layer 2016 can be applied to all pores 2010 or to selective pores 2010 as discussed herein in the context of silver layer 2012.

In step S1916, a top electrode 2018 is defined. The top electrode 2018 is preferably an electrically-conductive material such as a metal. In some embodiments, the top electrode 2018 is a thin film. The top electrode 2018 can be applied using various thin film deposition techniques as discussed and defined herein. In some embodiments, the top electrode 2018 is a plurality of distinct paths of metal. For example, the top electrode 2018 can consist of a plurality of substantially parallel strips of metal arranged perpendicular to the bottom electrodes 2006 to form the second half of a crossbar geometry as discussed herein. The top electrode 2018 can be applied in the desired path. Alternatively, a conductive material can be broadly applied over the porous membrane 2008 and selectively removed (e.g., by etching, machining, and the like) to form desired path.

Figure 20G:
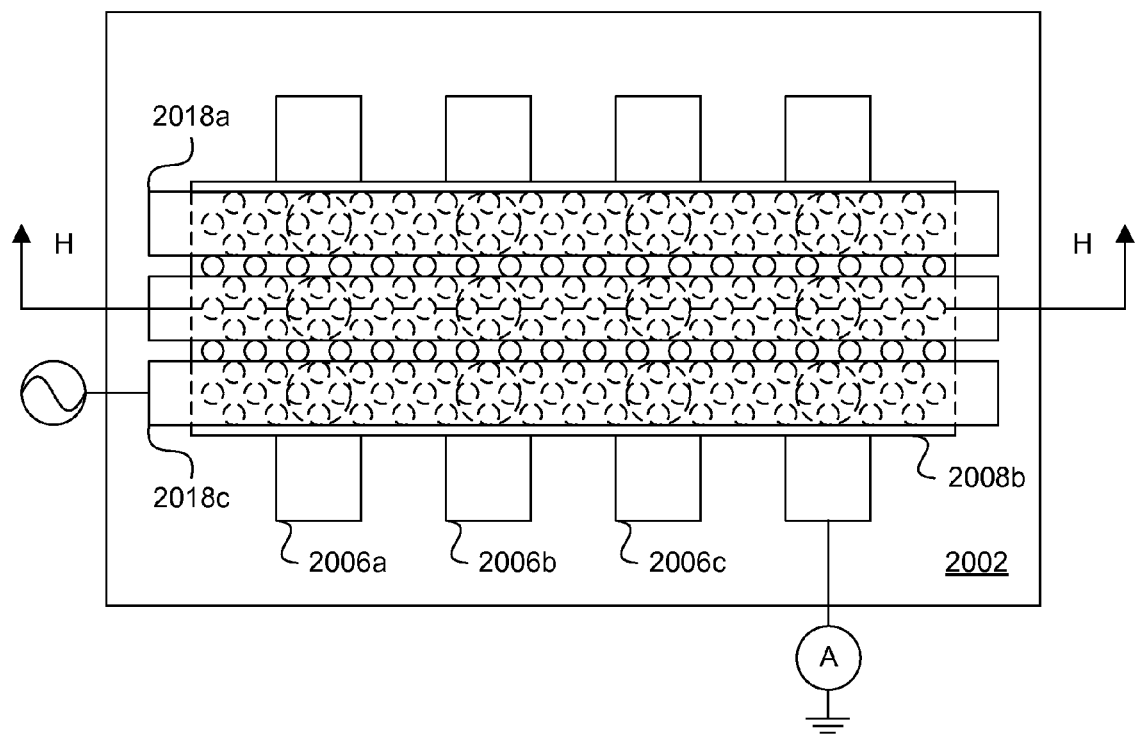
Figure 20H:
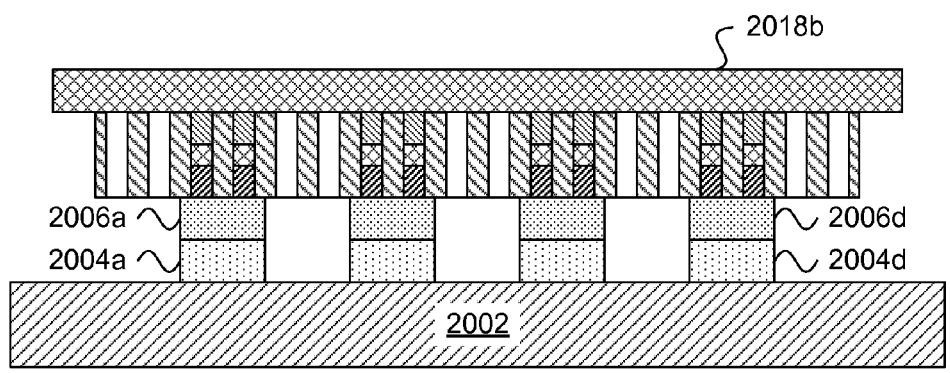

A schematic of an assembled memory device is depicted in FIGS. 20G and 20H. Memory devices fabricated according the techniques and architectures provided herein can theoretically achieve a packing density of over $10^{10}$ bits per square centimeter the top and bottom electrodes have a width of less than 50 nm.

Applications

Embodiments of the invention herein can be used in a variety of applications.

For example, embodiments of invention can be used to store a gigabyte of information on a foil that is about the size of a postage stamp, as thin as a hair, and cheaper than a penny. Such memory devices can provide data capacity exceeding that of existing optical disc, magnetic disc, and flash memory devices while still occupying a smaller footprint. Moreover, such memory devices can utilize low power. Such memory devices can displace compact discs (CDs) and digital video discs (DVDs) as the dominant means of storing, backing up, and transporting large volumes of data.

For example, audio, video, images, and/or computer programs can be encoded on the memory devices herein. Encoded memory device can, in some embodiments, interact directly with portable media devices such as the IPOD®, ITOUCH™, and IPHONE™ devices available from Apple Inc. of Cupertino, Calif. Encoded memory devices could be purchased by travelers at an airport for viewing on a portable media device during a flight. In still another embodiment, one or more memory devices described herein could interface with a digital camera.

In another example, embodiments of the memory devices described herein can be encoded with driver programs and incorporated into peripheral devices such as printers, keyboards, mouse devices, and the like. Such devices would truly be "plug and play" devices without the need for the driver to be manually loaded onto a computer from an optical disc or from the Internet.

In still another example, embodiments of the memory devices herein can be incorporated into documents such as currency, credit cards, debit cards, identification cards, and the like to verify their authenticity. In such embodiments, the memory device can store a private encryption key, preferably a large encryption key. When the authenticity of a document is verified, the document is placed within range of a verification device that communicates with a communication interface in the document (e.g., an RFID device) to receive a message encoded with the private key stored in the memory device. If the message can be decoded by the verification device with a known public key, then the document is authentic. If the message cannot be decoded by the verification device, the document is not authentic. Such an arrangement allows for the quick screening for counterfeit documents.

EQUIVALENTS

Those skilled in the art will recognize, or be able to ascertain using no more than routine experimentation, many equivalents of the specific embodiments of the invention described herein. Such equivalents are intended to be encompassed by the following claims.

INCORPORATION BY REFERENCE

The entire contents of all patents, published patent applications, and other references cited herein are hereby expressly incorporated herein in their entireties by reference.

The invention claimed is:

1. A memory device comprising:
    a plurality of silver/molecular-layer/metal (SMM) junctions; and
    an electrical structure configured to permit application of electricity across one or more of the plurality of SMM junctions,
    wherein the plurality of SMM junctions are formed within a porous membrane selected from a group consisting of: an alumina-membrane-based filter paper, an etched polycarbonate membrane, and an anodized metallic oxide film.

2. The memory device of claim 1, wherein the metallic oxide is selected from group consisting of: aluminum oxide, titanium oxide, and tantalum oxide.

3. The memory device of claim 1, wherein the electrical structure is a crossbar geometry.

4. The memory device of claim 1, further comprising a control device configured to selectively apply electricity across one or more of the SMM junctions via the electrical structure.

5. The memory device of claim 1, wherein the control device is further configured to calculate the conductance of one or more of the SMM junctions.

6. The memory device of claim 1, further comprising:
    an interface configured for communicative coupling with an external device.

7. The memory device of claim 6, wherein the interface is a wired interface.

8. The memory device of claim 6, wherein the wired interface is selected from the group consisting of: USB, USB 2.0, IEEE 1394, PCI, Ethernet, and Gigabit Ethernet.

9. The memory device of claim 6, wherein the interface is a wireless interface.

10. The memory device of claim 9, wherein the wireless interface is selected from the group consisting of: Bluetooth, IEEE 802.11, and IEEE 802.15.4.

11. The memory device of claim 6, wherein the control device is further configured to communicate with the external device via the interface.

12. The memory device of claim 1, wherein the SMM junctions include a metal-perchlorate salt.

13. The memory device of claim 1, wherein the SMM junctions include a metal layer includes one selected from the group consisting of: copper, gold, or nickel.

14. The memory device of claim 1, wherein the molecular layer comprises a thiol.

15. A method of storing data on a memory device including a plurality of SMM junctions, the method comprising:
    applying electrical energy across a subset of the SMM junctions to switch the junction to a more conductive state,
    wherein the plurality of SMM junctions are formed within a porous membrane selected from a group consisting of: an alumina-membrane-based filter paper, an etched polycarbonate membrane, and an anodized metallic oxide film.

16. The method of claim 15, wherein the electrical energy has an oscillating voltage.

17. The method of claim 15, wherein the electrical energy is applied a plurality of times across the subset of the SMM junctions.

18. A method of reading data on a memory device including a plurality of silver/molecular-layer/metal (SMM) junctions, the method comprising:
applying electrical energy across the SMM junctions;
determining the conductance of each of the SMM junctions; and
returning a data string including a "1" for each of the SMM junctions that exhibits a high conductance and a "0" for each of the SMM junctions that exhibits a low conductance,
wherein the plurality of SMM junctions are formed within a porous membrane selected from a group consisting of: an alumina-membrane-based filter paper, an etched polycarbonate membrane, and an anodized metallic oxide film.

19. A silver/molecular-layer/metal (SMM) junction comprising:
a silver layer;
a copper layer; and
a molecular layer positioned between the silver layer and the copper layer,
wherein the SMM junctions is formed within a porous membrane selected from a group consisting of: an alumina-membrane-based filter paper, an etched polycarbonate membrane, and an anodized metallic oxide film.

20. A memory device comprising:
a plurality of silver/molecular-layer/metal (SMM) junctions; and
an electrical structure configured to permit application of electricity across one or more of the plurality of SMM junctions,
wherein the plurality of SMM junctions include a metal-perchlorate salt.

21. A method of reading data on a memory device including a plurality of silver/molecular-layer/metal (SMM) junctions, the method comprising:
applying electrical energy across the SMM junctions;
determining the conductance of each of the SMM junctions; and
returning a data string including a "1" for each of the SMM junctions that exhibits a high conductance and a "0" for each of the SMM junctions that exhibits a low conductance,
wherein the plurality of SMM junctions include a metal-perchlorate salt.

22. A silver/molecular-layer/metal (SMM) junction comprising:
a silver layer;
a copper layer; and
a molecular layer positioned between the silver layer and the copper layer,
wherein the SMM junction includes a metal-perchlorate salt.

* * * * *